(12) United States Patent
Chyan

(10) Patent No.: US 9,639,221 B2
(45) Date of Patent: May 2, 2017

(54) METHOD OF DESIGNING A CONDUCTIVE PATTERN WITH REDUCED CHANNEL BREAK VISIBILITY

(71) Applicant: Eastman Kodak Company, Rochester, NY (US)

(72) Inventor: Yieu Chyan, Conroe, TX (US)

(73) Assignee: EASTMAN KODAK COMPANY, Rochester, NY (US)

( * ) Notice: Subject to any disclaimer, the term of this patent is extended or adjusted under 35 U.S.C. 154(b) by 289 days.

(21) Appl. No.: 14/496,007

(22) Filed: Sep. 25, 2014

(65) Prior Publication Data

US 2016/0091998 A1    Mar. 31, 2016

(51) Int. Cl.
| | | |
|---|---|---|
| *H03K 17/975* | (2006.01) | |
| *G06F 3/044* | (2006.01) | |
| *G06F 3/041* | (2006.01) | |
| *G06F 3/0488* | (2013.01) | |
| *G06F 17/50* | (2006.01) | |

(52) U.S. Cl.
CPC ........... *G06F 3/044* (2013.01); *G06F 3/0412* (2013.01); *G06F 3/04883* (2013.01); *G06F 17/5068* (2013.01); *G06F 2203/04111* (2013.01); *G06F 2203/04112* (2013.01)

(58) Field of Classification Search
CPC .. H03K 17/962; H03K 17/9622; H03K 17/98; H01H 2239/006; H01H 13/702; H01H 13/785; G06F 3/045; G06F 3/03545; G06F 3/044; G06F 3/041; G06F 3/046; G06F 3/0488; G06F 2203/04113

USPC ............... 200/600; 178/18.01, 18.05–18.07; 427/108, 97.3; 341/33, 34; 345/173
See application file for complete search history.

(56) References Cited

U.S. PATENT DOCUMENTS

| | | | | |
|---|---|---|---|---|
| 7,656,357 | B2 * | 2/2010 | Ishibashi | H01Q 1/1271 343/713 |
| 9,035,198 | B2 * | 5/2015 | Hwang | G02B 5/1866 174/268 |
| 9,377,646 | B2 * | 6/2016 | Westhues | G02F 1/13338 |
| 2014/0198269 | A1 | 7/2014 | Hwang et al. | |
| 2014/0248422 | A1 | 9/2014 | Jin et al. | |

OTHER PUBLICATIONS

International Search Report of the International Searching Authority (Korea) for international application PCT/US2014/057371 dated May 29, 2015.
Written Opinion of the International Searching Authority (Korea) for international application PCT/US2014/057371 dated May 29, 2015.

* cited by examiner

*Primary Examiner* — Vanessa Girardi
(74) *Attorney, Agent, or Firm* — Kevin E. Spaulding

(57) ABSTRACT

A method of designing a conductive pattern with reduced channel break visibility includes generating a representation of the conductive pattern in a software application and placing a plurality of non-linear channel break voids that partition the conductive pattern into a plurality of channels. Each non-linear channel break isolates adjacent channels.

8 Claims, 16 Drawing Sheets

METHOD OF DESIGNING A CONDUCTIVE PATTERN WITH REDUCED CHANNEL BREAK VISIBILITY

BACKGROUND OF THE INVENTION

A touch screen enabled system allows a user to control various aspects of the system by touch or gestures on the screen. For example, a user may interact directly with one or more objects depicted on a display device by touch or gestures that are sensed by a touch sensor. The touch sensor typically includes a conductive pattern disposed on a substrate configured to sense touch. Touch screens are commonly used in consumer, commercial, and industrial systems.

BRIEF SUMMARY OF THE INVENTION

According to one aspect of one or more embodiments of the present invention, a method of designing a conductive pattern with reduced channel break visibility includes generating a representation of the conductive pattern in a software application and placing a plurality of non-linear channel break voids that partition the conductive pattern into a plurality of channels. Each non-linear channel break isolates adjacent channels.

According to one aspect of one or more embodiments of the present invention, a touch sensor with reduced channel break visibility includes a first conductive pattern comprising a first plurality of channels where adjacent channels are electrically isolated from each other by a non-linear channel break and a second conductive pattern comprising a second plurality of channels where adjacent channels are electrically isolated from each other by a non-linear channel break.

Other aspects of the present invention will be apparent from the following description and claims.

DETAILED DESCRIPTION OF THE INVENTION

Figure 1:
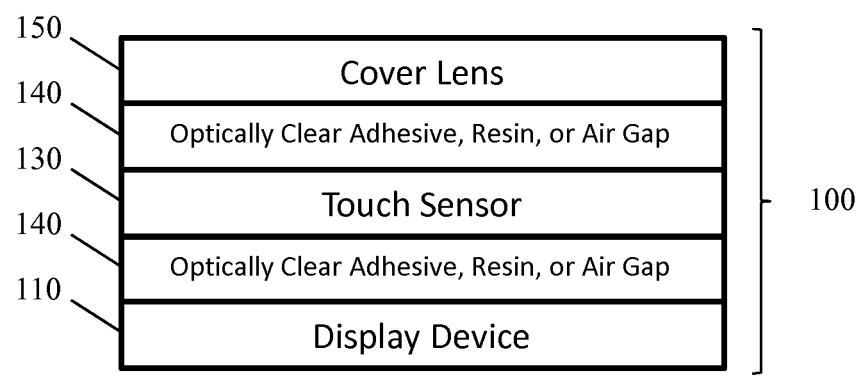
FIG. 1 shows a cross section of a touch screen in accordance with one or more embodiments of the present invention.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one of ordinary skill in the art are not described to avoid obscuring the description of the present invention.

FIG. 1 shows a cross-section of a touch screen 100 in accordance with one or more embodiments of the present invention. Touch screen 100 includes a display device 110. Display device 110 may be a Liquid Crystal Display ("LCD"), Light-Emitting Diode ("LED"), Organic Light-Emitting Diode ("OLED"), Active Matrix Organic Light-Emitting Diode ("AMOLED"), In-Plane Switching ("IPS"), or other type of display device suitable for use as part of a touch screen application or design. In one or more embodiments of the present invention, touch screen 100 may include a touch sensor 130 that overlays at least a portion of a viewable area of display device 110. The viewable area of display device 110 includes the area defined by the light emitting pixels (not shown) of the display device 110 that are typically viewable to an end user. In certain embodiments, an optically clear adhesive or resin 140 may bond a bottom side of touch sensor 130 to a top, or user-facing, side of display device 110. In other embodiments, an isolation layer, or air gap, 140 may separate the bottom side of touch sensor 130 from the top, or user-facing, side of display device 110. A cover lens 150 may overlay a top, or user-facing, side of touch sensor 130. Cover lens 150 may be composed of glass, plastic, film, or other material. In certain embodiments, an optically clear adhesive or resin 140 may bond a bottom side of cover lens 150 to the top, or user-facing, side of touch sensor 130. In other embodiments, an isolation layer, or air gap, 140 may separate the bottom side of cover lens 150 and the top, or user-facing, side of touch sensor 130. In still other embodiments, a direct polymer hard coating, such as, for example, an optically clear resin 140, may be used instead of a cover lens 150 and may serve substantially the same function of the cover lens 150. A top side of cover lens 150 faces the user and protects the underlying components of touch screen 100. In one or more embodiments of the present invention, touch sensor 130, or the function or functions that it implements, may be integrated into the display device 110 itself (not independently illustrated). One of ordinary skill in the art will recognize that touch sensor 130 may be a capacitive, resistive, or other type of touch sensor capable of sensing touch.

Figure 2:
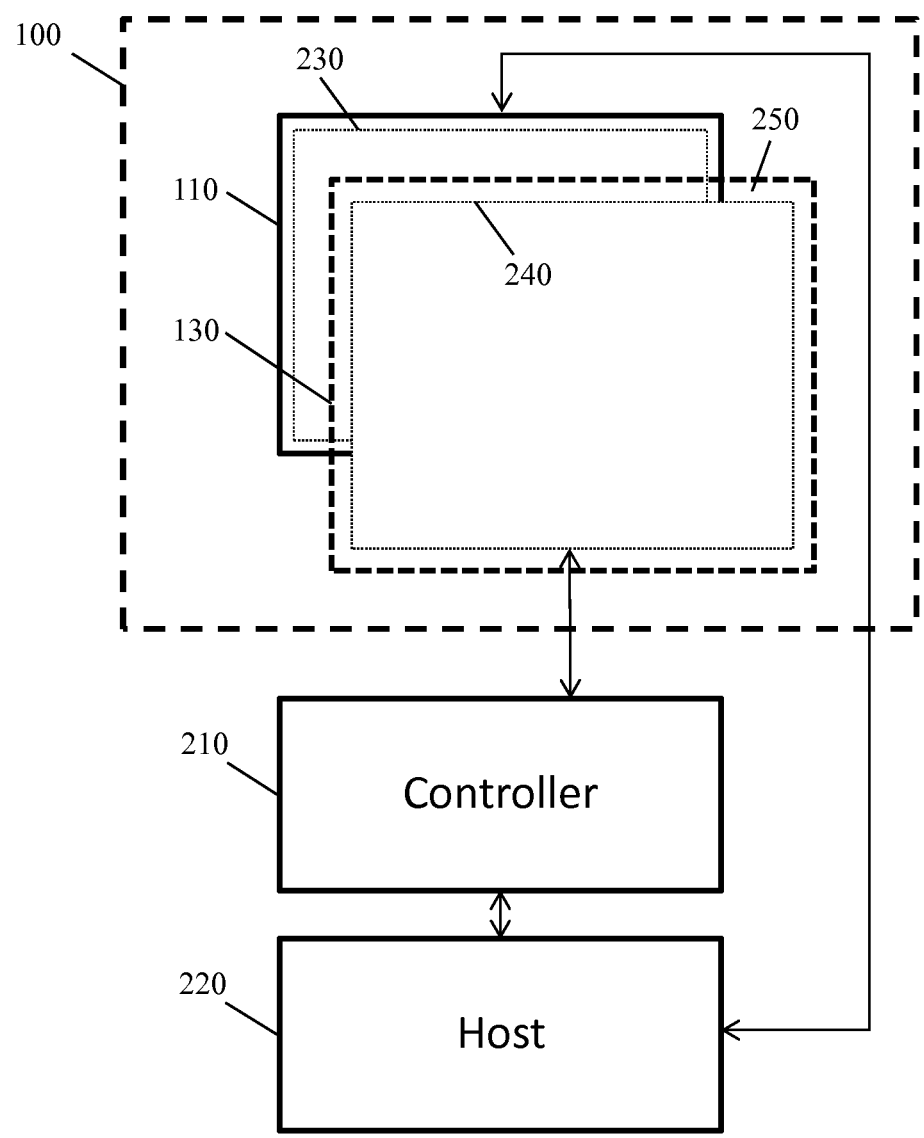
FIG. 2 shows a schematic view of a touch screen enabled computing system in accordance with one or more embodiments of the present invention.

FIG. 2 shows a schematic view of a touch screen enabled computing system 200 in accordance with one or more embodiments of the present invention. Computing system 200 may be a consumer computing system, commercial computing system, or industrial computing system including, but not limited to, a smartphone, a tablet computer, a laptop computer, a desktop computer, a printer, a monitor, a television, an appliance, a kiosk console, an automatic teller machine, a copier, a desktop phone, an automotive display system, a portable gaming device, a gaming console, or any other system suitable for use with touch screen 100. Computing system 200 may include one or more printed or flex circuits (not shown) on which one or more processors (not shown) and system memory (not shown) may be disposed. Each of the one or more processors may be a single-core processor (not shown) or a multi-core processor (not shown) capable of executing software instructions. Multi-core processors typically include a plurality of processor cores disposed on the same physical die (not shown) or a plurality of processor cores disposed on multiple die (not shown) disposed within the same mechanical package (not shown). Computing system 200 may include one or more input/output devices (not shown), one or more local storage devices (not shown) including solid-state memory, a fixed disk drive, a fixed disk drive array, or any other non-transitory computer readable medium, a network interface device (not shown), and/or one or more network storage devices (not shown) including a network-attached storage device and a cloud-based storage device.

In certain embodiments, touch screen 100 may include touch sensor 130 that overlays at least a portion of a viewable area 230 of display device 110. Touch sensor 130 may include a viewable area 240 that corresponds to that portion of the touch sensor 130 that overlays the light emitting pixels (not shown) of display device 110. Touch sensor 130 may include a bezel area 250 outside at least one side of the viewable area 240 that provides connectivity between touch sensor 130 and a controller 210. In other embodiments, touch sensor 130, or the function or functions that it implements, may be integrated into display device 110 itself (not independently illustrated). Controller 210 electrically drives at least a portion of touch sensor 130. Touch sensor 130 senses touch (capacitance, resistance, optical, acoustic, or other technology) and conveys information corresponding to the sensed touch to controller 210. In typical applications, the manner in which the sensing of touch is measured, tuned, and/or filtered may be configured by controller 210. In addition, controller 210 may recognize one or more gestures based on the sensed touch or touches. Controller 210 provides host 220 with touch or gesture information corresponding to the sensed touch or touches. Host 220 may use this touch or gesture information as user input and respond in an appropriate manner. In this way, the user may interact with computing system 200 by touch or gestures on touch screen 100. In certain embodiments, host 220 may be the one or more printed or flex circuits (not shown) on which the one or more processors (not shown) are disposed. In other embodiments, host 220 may be a subsystem or any other part of computing system 200 that may be configured to interface with display device 110 and controller 210.

Figure 3:
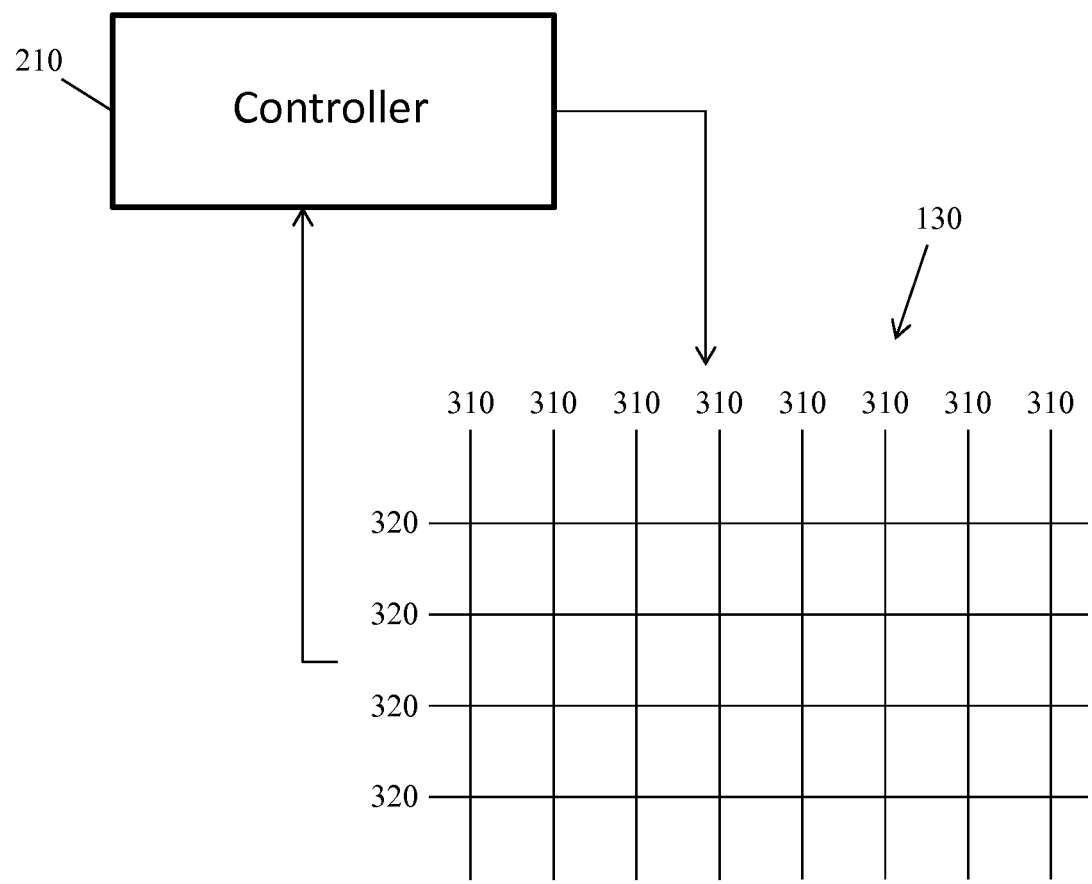
FIG. 3 shows a functional representation of a touch sensor as part of a touch screen in accordance with one or more embodiments of the present invention.

FIG. 3 shows a functional representation of a touch sensor 130 as part of a touch screen 100 in accordance with one or more embodiments of the present invention. In certain embodiments, touch sensor 130 may be viewed as a plurality of column channels 310 and a plurality of row channels 320 arranged as a mesh grid. The number of column channels 310 and the number of row channels 320 may not be the same and may vary based on an application or a design. The apparent intersections of column channels 310 and row channels 320 may be viewed as uniquely addressable locations of touch sensor 130. In operation, controller 210 may electrically drive one or more row channels 320 and touch sensor 130 may sense touch on one or more column channels 310 that are sampled by controller 210. One of ordinary skill in the art will recognize that the role of row channels 320 and column channels 310 may be reversed such that controller 210 electrically drives one or more column channels 310 and touch sensor 130 senses touch on one or more row channels 320 that are sampled by controller 210.

In certain embodiments, controller 210 may interface with touch sensor 130 by a scanning process. In such an embodiment, controller 210 may electrically drive a selected row channel 320 (or column channel 310) and sample all column channels 310 (or row channels 320) that intersect the selected row channel 320 (or the selected column channel 310) by measuring, for example, capacitance at each intersection. This process may be continued through all row channels 320 (or all column channels 310) such that capacitance is measured at each uniquely addressable location of touch sensor 130 at predetermined intervals. Controller 210 may allow for the adjustment of the scan rate depending on the needs of a particular application or design. One of ordinary skill in the art will recognize that the scanning process discussed above may also be used with other touch sensor technologies in accordance with one or more embodiments of the present invention. In other embodiments, controller 210 may interface with touch sensor 130 by an interrupt driven process. In such an embodiment, a touch or a gesture generates an interrupt to controller 210 that triggers controller 210 to read one or more of its own registers that store sensed touch information sampled from touch sensor 130 at predetermined intervals. One of ordinary skill in the art will recognize that the mechanism by which touch or gestures are sensed by touch sensor 130 and sampled by controller 210 may vary based on an application or a design in accordance with one or more embodiments of the present invention.

Figure 4:
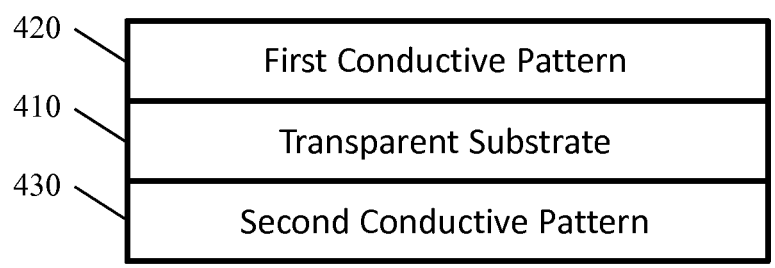
FIG. 4 shows a cross-section of a touch sensor with conductive patterns disposed on opposing sides of a transparent substrate in accordance with one or more embodiments of the present invention.

FIG. 4 shows a cross-section of a touch sensor 130 with conductive patterns 420 and 430 disposed on opposing sides of a transparent substrate 410 in accordance with one or more embodiments of the present invention. In certain embodiments, touch sensor 130 may include a first conductive pattern 420 disposed on a top, or user-facing, side of a transparent substrate 410 and a second conductive pattern 430 disposed on a bottom side of the transparent substrate 410. The first conductive pattern 420 may overlay the second conductive pattern 430 at a predetermined alignment that may include an offset. One of ordinary skill in the art will recognize that a conductive pattern may be any shape or pattern of one or more conductors (not shown) in accordance with one or more embodiments of the present invention. One of ordinary skill in the art will also recognize that any type of touch sensor 130 conductor, including, for example, metal conductors, metal mesh conductors, indium tin oxide ("ITO") conductors, poly(3,4-ethylenedioxythiophene ("PEDOT") conductors, carbon nanotube conductors, silver nanowire conductors, or any other touch sensor 130 conductors may be used in accordance with one or more embodiments of the present invention.

One of ordinary skill in the art will recognize that any touch sensor 130 stackup may be used in accordance with one or more embodiments of the present invention. For example, single-sided touch sensor 130 stackups may include conductors disposed on a single side of a substrate 410 where conductors that cross are isolated from one another by a dielectric material (not shown), such as, for example, as used in On Glass Solution ("OGS") touch sensor 130 embodiments. Double-sided touch sensor 130 stackups may include conductors disposed on opposing sides of the same substrate 140 (as shown in FIG. 4) or bonded touch sensor 130 embodiments where conductors are disposed on at least two different sides of at least two different substrates 410. Bonded touch sensor 130 stackups may include, for example, two single-sided substrates 410 bonded together, one double-sided substrate 410 bonded to a single-sided substrate 410, or a double-sided substrate 410 bonded to another double-sided substrate 410. One of ordinary skill in the art will recognize that other touch sensor 130 stackups, including those that vary in the number, type, or organization of substrate(s) and/or conductive pattern(s) are within the scope of one or more embodiments of the present invention. One of ordinary skill in the art will also recognize that one or more of the above-noted embodiments may be used in applications or designs where touch sensor 130 is integrated into display device 110 in accordance with one or more embodiments of the present invention.

A conductive pattern (e.g., first conductive pattern 420 or second conductive pattern 430) may be disposed on one or more transparent substrates 410 by any process suitable for disposing conductive lines or features on a substrate. Suitable processes may include, for example, printing processes, vacuum-based deposition processes, solution coating processes, or cure and etch processes that either form conductive lines or features on substrate or form seed lines or features on substrate that may be further processed to form conductive lines or features on substrate. Printing processes may include flexographic printing of catalytic seed lines or features on substrate that are metallized by an electroless plating process or an immersion plating process, direct flexographic printing of a conductive ink or material on substrate, gravure printing, inkjet printing, rotary printing, or stamp printing. Deposition processes may include pattern-based deposition, chemical vapor deposition, electro deposition, epitaxy, physical vapor deposition, or casting. Cure and etch processes may include optical or UV-based photolithography, e-beam/ion-beam lithography, x-ray lithography, interference lithography, scanning probe lithography, imprint lithography, or magneto lithography. One of ordinary skill in the art will recognize that any process or combination of processes suitable for disposing conductive lines or features on substrate may be used in accordance with one or more embodiments of the present invention.

With respect to transparent substrate 410, transparent means capable of transmitting a substantial portion of visible light through the substrate. In certain embodiments, transparent substrate 410 may be polyethylene terephthalate ("PET"), polyethylene naphthalate ("PEN"), cellulose acetate ("TAC"), cycloaliphatic hydrocarbons ("COP"), polymethylmethacrylates ("PMMA"), polyimide ("PI"), bi-axially-oriented polypropylene ("BOPP"), polyester, polycarbonate, glass, copolymers, blends, or combinations thereof. In other embodiments, transparent substrate 410 may be any other transparent material suitable for use as a touch sensor substrate. One of ordinary skill in the art will recognize that the composition of transparent substrate 410 may vary based on an application or design in accordance with one or more embodiments of the present invention.

Figure 5A:
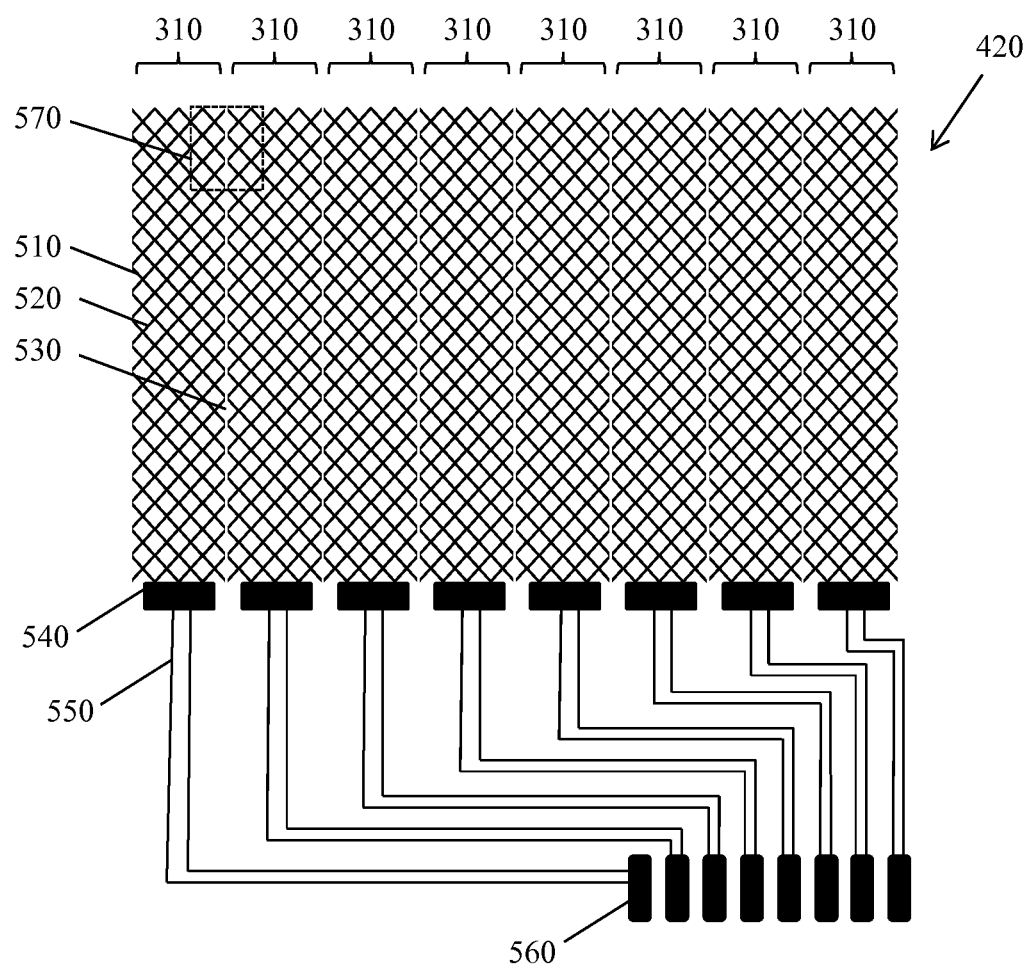
FIG. 5A shows a first conductive pattern disposed on a transparent substrate in accordance with one or more embodiments of the present invention.

FIG. 5A shows a first conductive pattern 420 disposed on a transparent substrate (e.g., transparent substrate 410) in accordance with one or more embodiments of the present invention. In certain embodiments, first conductive pattern 420 may include a mesh formed by a plurality of parallel conductive lines oriented in a first direction 510 and a plurality of parallel conductive lines oriented in a second direction 520 that are disposed on a side of a transparent substrate (e.g., transparent substrate 410). One of ordinary skill in the art will recognize that the number of parallel conductive lines oriented in the first direction 510 and/or the number of parallel conductive lines oriented in the second direction 520 may vary based on an application or design. One of ordinary skill in the art will also recognize that a size of first conductive pattern 420 may vary based on an application or a design. In other embodiments, first conductive pattern 420 may include any other shape or pattern formed by one or more conductive lines or features (not independently illustrated). One of ordinary skill in the art will recognize that a conductive pattern is not limited to parallel conductive lines and may comprise any one or more of a predetermined orientation of line segments, a random orientation of line segments, curved line segments, conductive particles, polygons, or any other shape(s) or pattern(s) comprised of electrically conductive material (not independently illustrated) in accordance with one or more embodiments of the present invention.

In certain embodiments, the plurality of parallel conductive lines oriented in the first direction 510 may be perpendicular to the plurality of parallel conductive lines oriented in the second direction 520, thereby forming the mesh. In other embodiments, the plurality of parallel conductive lines oriented in the first direction 510 may be angled (not shown) relative to the plurality of parallel conductive lines oriented in the second direction 520, thereby forming the mesh. One of ordinary skill in the art will recognize that the relative angle between the plurality of parallel conductive lines oriented in the first direction 510 and the plurality of parallel conductive lines oriented in the second direction 520 may vary based on an application or a design in accordance with one or more embodiments of the present invention.

In certain embodiments, a plurality of channel breaks 530 may partition first conductive pattern 420 into a plurality of column channels 310, each electrically isolated from the others. One of ordinary skill in the art will recognize that the number of channel breaks 530 and/or the number of column channels 310 may vary based on an application or design in accordance with one or more embodiments of the present invention. Each column channel 310 may route to a channel pad 540. Each channel pad 540 may route to an interface connector 560 by way of one or more interconnect conductive lines 550. Interface connectors 560 may provide a connection interface between a touch sensor (e.g., 130 of FIG. 1) and a controller (e.g., 210 of FIG. 2).

Figure 5B:
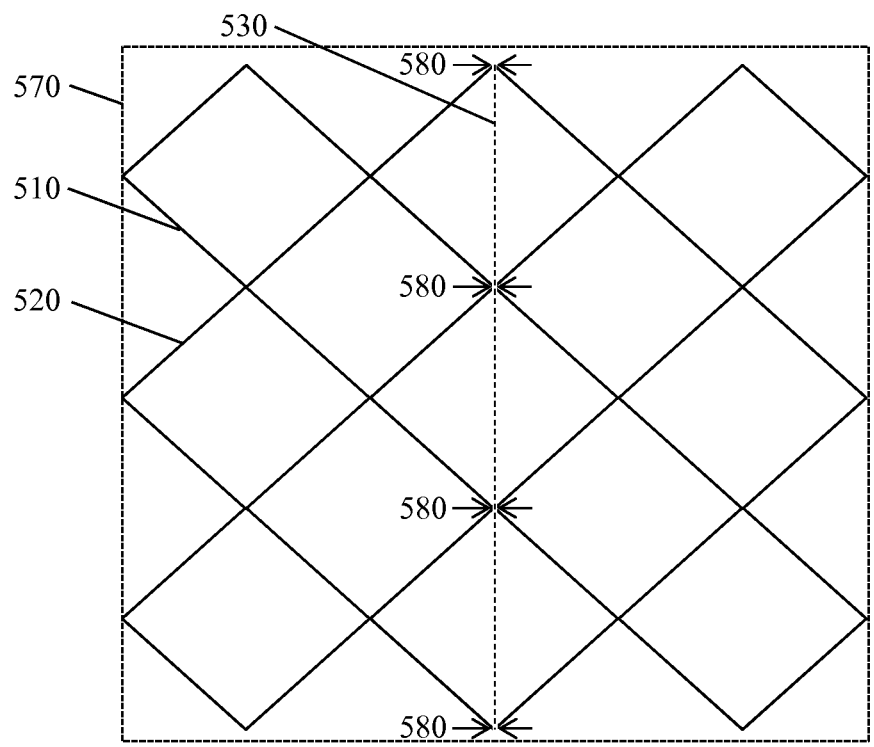
FIG. 5B shows a zoomed in portion of the first conductive pattern of FIG. 5A in accordance with one or more embodiments of the present invention.

FIG. 5B shows a zoomed in portion 570 of the first conductive pattern 420 of FIG. 5A. In a conventional touch sensor, each conventional linear channel break 530 includes a plurality of linearly-aligned non-conductive gaps 580 that span a length of the first conductive pattern 420 and partition it into electrically isolated column channels (e.g., 310 of FIG. 5A). The gaps 580 are devoid of conductive material and there is no conductivity between adjacent conductors on opposing sides of the gaps 580. While each conventional linear channel break 530 is formed by a plurality of gaps 580, conventional linear channel break 530 is shown as a dashed line in FIG. 5B to highlight the linearly-aligned shape of the gaps 580.

Because the gaps 580 are linearly-aligned with respect to a vertical axis (vis-à-vis channel break 530) and span at least a significant length (e.g., consecutive gaps 580) of the first conductive pattern 420, conventional linear channel breaks 530 are discernible to the human eye and render the first conductive pattern 420 more visibly apparent. The human eye tends to integrate or otherwise recognize the pattern of the linearly-aligned gaps 580 as ghost lines as is evident in FIG. 5A. While various aspects of the first conductive pattern 420 may vary based on an application or design, including, for example, the relative angle between the plurality of parallel conductive lines oriented in the first direction 510 and the plurality of parallel conductive lines oriented in the second direction 520, conventional linear channel breaks 530 remain discernible, regardless of where the conventional linear channel breaks 530 appear to intersect the parallel conductive lines 510, 520. In the design of a conventional touch sensor, a representation of the first conductive pattern 420 may be created by placing representations of the plurality of parallel conductive lines (e.g., 510 and 520 of FIG. 5) and then placing a plurality of conventional linear channel voids (not shown), essentially void lines, that correspond to the shape of the conventional linear channel breaks 530 in, for example, a computer-aided drafting ("CAD") software application prior to fabrication.

Figure 6A:
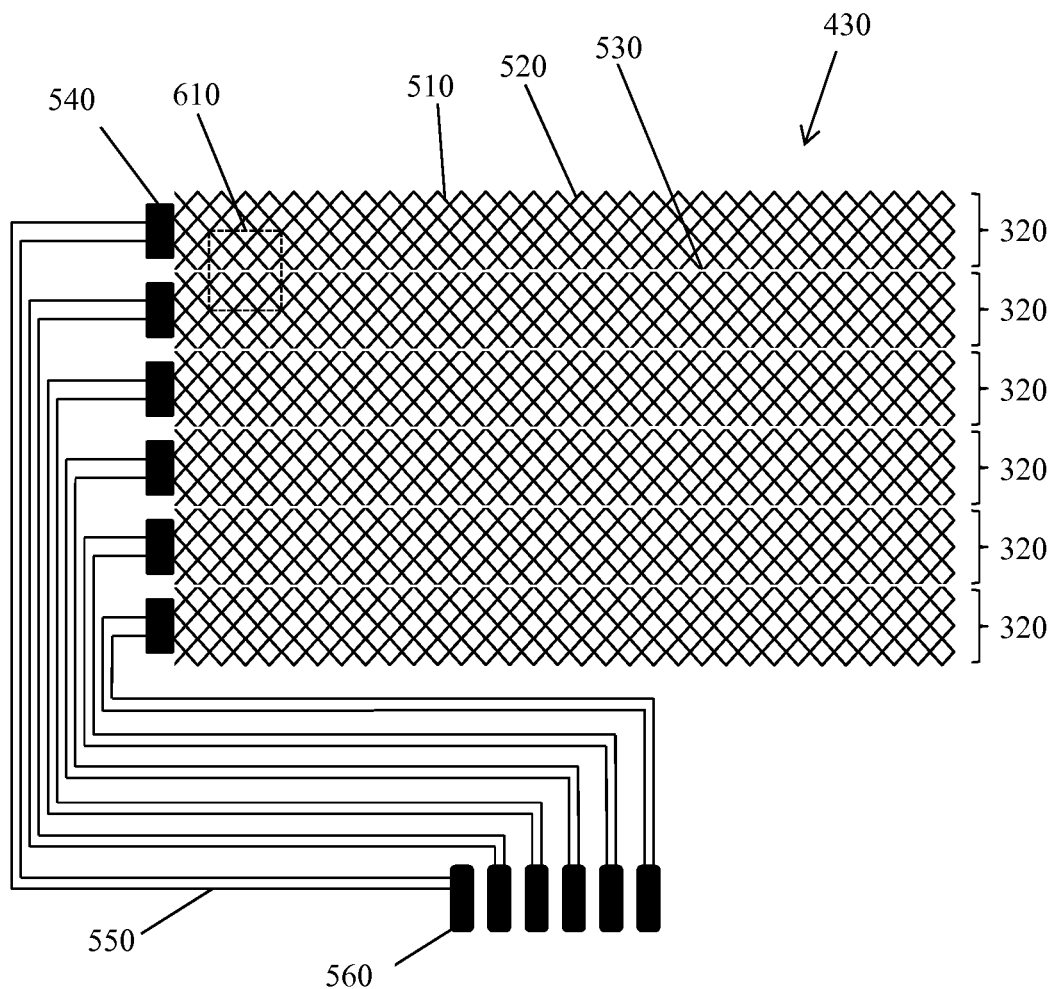
FIG. 6A shows a second conductive pattern disposed on a transparent substrate in accordance with one or more embodiments of the present invention.

FIG. 6A shows a second conductive pattern 430 disposed on a transparent substrate (e.g., transparent substrate 410) in accordance with one or more embodiments of the present invention. In certain embodiments, second conductive pattern 430 may include a mesh formed by a plurality of parallel conductive lines oriented in a first direction 510 and a plurality of parallel conductive lines oriented in a second direction 520 that are disposed on a side of a transparent substrate (e.g., transparent substrate 410). One of ordinary skill in the art will recognize that the number of parallel conductive lines oriented in the first direction 510 and/or the number of parallel conductive lines oriented in the second direction 520 may vary based on an application or design. The second conductive pattern 430 may be substantially similar in size to the first conductive pattern 420. One of ordinary skill in the art will recognize that a size of the second conductive pattern 430 may vary based on an application or a design. In other embodiments, second conductive pattern 430 may include any other shape or pattern formed by one or more conductive lines or features (not independently illustrated). One of ordinary skill in the art will also recognize that a conductive pattern is not limited to parallel conductive lines and could be any one or more of a predetermined orientation of line segments, a random orientation of line segments, curved line segments, conductive particles, polygons, or any other shape(s) or pattern(s) comprised of electrically conductive material (not independently illustrated) in accordance with one or more embodiments of the present invention.

In certain embodiments, the plurality of parallel conductive lines oriented in the first direction 510 may be perpendicular to the plurality of parallel conductive lines oriented in the second direction 520, thereby forming the mesh. In other embodiments, the plurality of parallel conductive lines oriented in the first direction 510 may be angled relative to the plurality of parallel conductive lines oriented in the second direction 520, thereby forming the mesh. One of ordinary skill in the art will recognize that the relative angle between the plurality of parallel conductive lines oriented in the first direction 510 and the plurality of parallel conductive lines oriented in the second direction 520 may vary based on an application or a design in accordance with one or more embodiments of the present invention.

In certain embodiments, a plurality of channel breaks 530 may partition second conductive pattern 430 into a plurality of row channels 320, each electrically isolated from the others. One of ordinary skill in the art will recognize that the number of channel breaks 530 and/or the number of row channels 320 may vary based on an application or design in accordance with one or more embodiments of the present invention. Each row channel 320 may route to a channel pad 540. Each channel pad 540 may route to an interface connector 560 by way of one or more interconnect conductive lines 550. Interface connectors 560 may provide a connection interface between a touch sensor (e.g., 130 of FIG. 1) and a controller (e.g., 210 of FIG. 2).

Figure 6B:
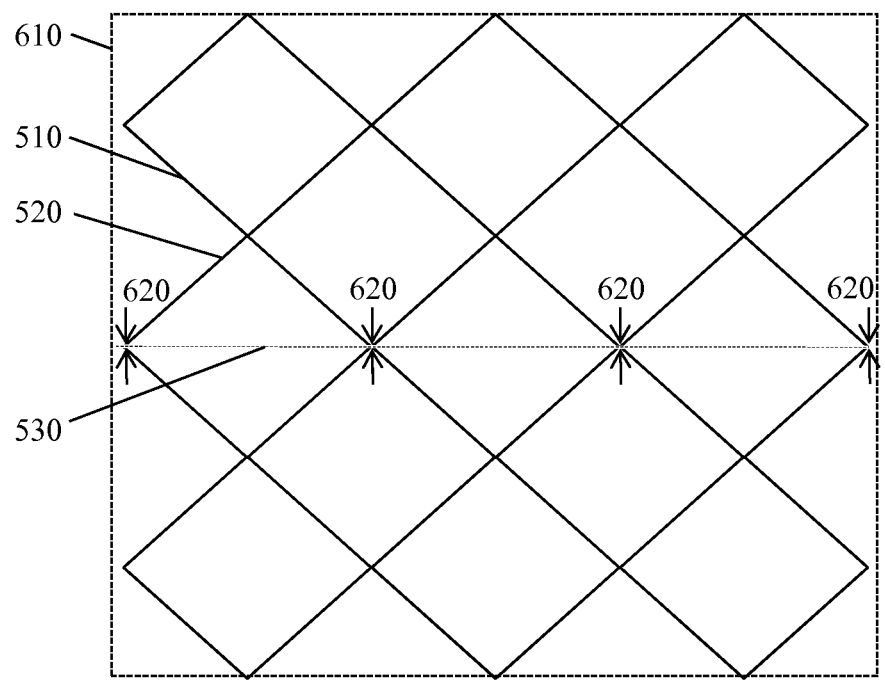
FIG. 6B shows a zoomed in portion of the second conductive pattern of FIG. 6A in accordance with one or more embodiments of the present invention.

FIG. 6B shows a zoomed in portion 610 of the second conductive pattern 430 of FIG. 6A. In a conventional touch sensor, each conventional linearly-aligned channel break 530 includes a plurality of linearly-aligned non-conductive gaps 620 that span a width of the second conductive pattern 430 and partition it into electrically isolated row channels (e.g., 320 of FIG. 6A). The gaps 620 are devoid of conductive material and there is no conductivity between adjacent conductors on opposing sides of the gaps 620. While each conventional linear channel break 530 is formed by a plurality of gaps 620, conventional linear channel break 530 is shown as a dashed line in FIG. 6B to highlight the linearly-aligned shape of the gaps 620.

Because the gaps 620 are linearly-aligned with respect to a horizontal axis (vis-à-vis channel break 530) and span at least a significant width (e.g., consecutive gaps 580) of the second conductive pattern 430, conventional linear channel breaks 530 are discernible to the human eye and render the second conductive pattern 430 more visibly apparent. The human eye tends to integrate or otherwise recognize the pattern of the linearly-aligned gaps 620 as ghost lines as is evident in FIG. 6A. While various aspects of the second conductive pattern 430 may vary based on an application or design, including, for example, the relative angle between the plurality of parallel conductive lines oriented in the first direction 510 and the plurality of parallel conductive lines oriented in the second direction 520, conventional linear channel breaks 530 remain discernible, regardless of where the conventional linear channel breaks 530 appear to intersect the parallel conductive lines 510, 520. In the design of a conventional touch sensor, a representation of the second conductive pattern 430 may be created by placing representations of the plurality of parallel conductive lines (e.g., 510 and 520 of FIG. 6) and then placing a plurality of conventional linear channel voids (not shown), essentially void lines, that correspond to the shape of the conventional linear channel breaks 530 in, for example, the CAD software application prior to fabrication.

Figure 7:
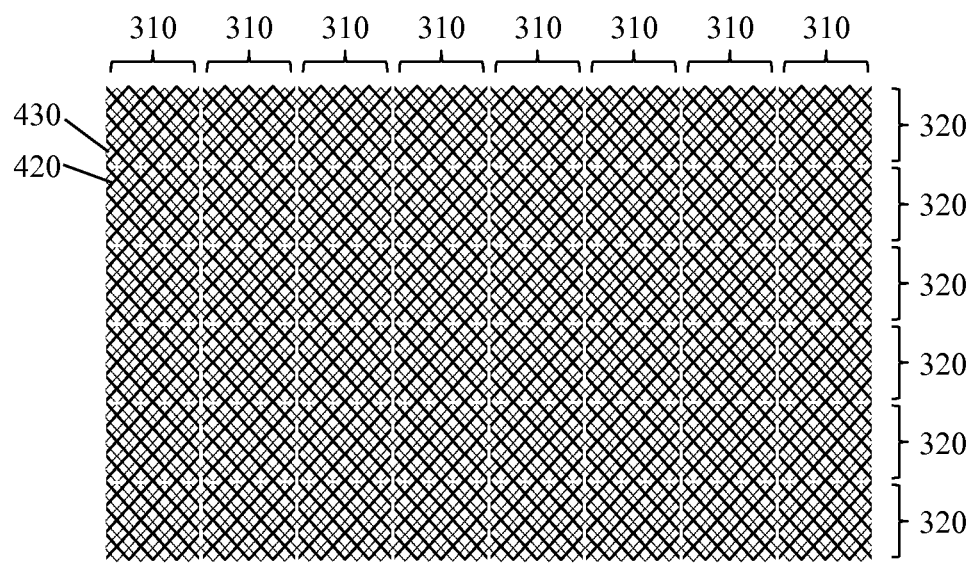
FIG. 7 shows a portion of a touch sensor in accordance with one or more embodiments of the present invention.

FIG. 7 shows a portion of a touch sensor 130 in accordance with one or more embodiments of the present invention. In certain embodiments, a touch sensor 130 may be formed, for example, by disposing a first conductive pattern 420 on a top, or user-facing, side of a transparent substrate (e.g., transparent substrate 410) and disposing a second conductive pattern 430 on a bottom side of the transparent substrate. In other embodiments, a touch sensor 130 may be formed, for example, by disposing a first conductive pattern 420 on a side of a first transparent substrate (e.g., transparent substrate 410), disposing a second conductive pattern 430 on a side of a second transparent substrate (e.g., transparent substrate 410), and bonding the first transparent substrate to the second transparent substrate. One of ordinary skill in the art will recognize that the disposition of the conductive pattern or patterns may vary based on the touch sensor 130 application or design in accordance with one or more embodiments of the present invention. The first conductive pattern 420 and the second conductive pattern 430 may be offset vertically, horizontally, and/or angularly relative to one another. The offset between the first conductive pattern 420 and the second conductive pattern 430 may vary based on an application or a design.

In certain embodiments, the first conductive pattern 420 may include a plurality of parallel conductive lines oriented in a first direction (e.g., 510 of FIG. 5A) and a plurality of parallel conductive lines oriented in a second direction (e.g., 520 of FIG. 5A) that form a mesh in this instance. The first conductive pattern 420 may be partitioned by a plurality of channel breaks (e.g., 530 of FIG. 5B) into electrically isolated column channels 310. In a conventional touch sensor, each conventional linearly-aligned channel break (e.g., 530 of FIG. 5B) includes a plurality of linearly-aligned non-conductive gaps (e.g., 580 of FIG. 5B) that span a length of the first conductive pattern 420 and partition it into electrically isolated column channels 310.

In certain embodiments, the second conductive pattern 430 may include a plurality of parallel conductive lines oriented in a first direction (e.g., 510 of FIG. 6A) and a plurality of parallel conductive lines oriented in a second direction (e.g., 520 of FIG. 6A) that form a mesh in this instance. The second conductive pattern 420 may be partitioned by a plurality of channel breaks (e.g., 530 of FIG. 6B) into electrically isolated row channels 320. In a conventional touch sensor, each conventional linearly-aligned channel break (e.g., 530 of FIG. 6B) includes a plurality of linearly-aligned non-conductive gaps (e.g., 620 of FIG. 6B) that span a width of the second conductive pattern 430 and partition it into electrically isolated row channels 320. In operation, a controller (e.g., 210 of FIG. 2) may electrically drive one or more row channels 320 (or column channels 310) and touch sensor 130 senses touch on one or more column channels 310 (or row channels 320) sampled by the controller. In other embodiments, the disposition and/or the role of the first conductive pattern 420 and the second conductive pattern 430 may be reversed.

In certain embodiments, one or more of the plurality of parallel conductive lines oriented in a first direction (e.g., 510 of FIG. 5 or FIG. 6), one or more of the plurality of parallel conductive lines oriented in a second direction (e.g., 520 of FIG. 5 or FIG. 6), one or more of the plurality of channel breaks (e.g., 530 of FIG. 5 or FIG. 6), one or more of the plurality of channel pads (e.g., 540 of FIG. 5 or FIG. 6), one or more of the plurality of interconnect conductive lines (e.g., 550 of FIG. 5 or FIG. 6), and/or one or more of the plurality of interface connectors (e.g., 560 of FIG. 5 or FIG. 6) of the first conductive pattern 420 and/or the second conductive pattern 430 may have different line widths, orientations, and/or feature sizes. Each may vary in one or more of line width, orientation, and/or feature size. In certain embodiments, the plurality of parallel conductive lines oriented in the first direction (e.g., 510 of FIG. 5 or FIG. 6) may have approximately the same line width and the plurality of parallel lines oriented in the second direction (e.g., 520 of FIG. 5 or FIG. 6) may have approximately the same line width. In addition, the number of parallel conductive lines oriented in the first direction (e.g., 510 of FIG. 5 or FIG. 6), the number of parallel conductive lines oriented in the second direction (e.g., 520 of FIG. 5 or FIG. 6), and the line-to-line spacing between them may vary based on an application or a design. One of ordinary skill in the art will recognize that the size, configuration, and design of each conductive pattern may vary based on an application or a design in accordance with one or more embodiments of the present invention.

In certain embodiments, one or more of the plurality of parallel conductive lines oriented in the first direction (e.g., 510 of FIG. 5 or FIG. 6) and one or more of the plurality of parallel conductive lines oriented in the second direction (e.g., 520 of FIG. 5 or FIG. 6) may have a line width that varies based on an application or design, including, for example, micrometer-fine line widths. One of ordinary skill in the art will recognize that the shape and width of one or more of the plurality of parallel conductive lines oriented in the first direction (e.g., 510 of FIG. 5 or FIG. 6) and one or more of the plurality of parallel conductive lines oriented in the second direction (e.g., 520 of FIG. 5 or FIG. 6) may vary based on an application or a design in accordance with one or more embodiments of the present invention.

While the use of a plurality of conventional linear channel breaks 530 simplifies the design-side process of partitioning a representation of a conductive pattern (e.g., first conductive pattern 420 and/or second conductive pattern 430) into a plurality of channels (e.g., column channels 310 and/or row channels 320) prior to fabrication, the fabricated touch sensor is rendered more visibly apparent by the conventional linear channel breaks 530. The human eye tends to integrate or otherwise recognize the pattern of gaps of the conventional linear channel breaks 530 as gap, or ghost, lines that are discernible and stand out in contrast to the plurality of parallel conductive lines or features (e.g., conductive lines 510 and/or 520 of FIG. 5 or FIG. 6).

As such, the conventional linear channel breaks 530 that partition the first conductive pattern 420 into a plurality of column channels 310 are visibly apparent as gap, or ghost, lines 530 and, because of their contrast with the plurality of parallel conductive lines or features (e.g., conductive lines 510 and 520 of FIG. 5), renders the first conductive pattern 420 more visibly apparent. Similarly, the conventional linear channel breaks 530 that partition the second conductive pattern 430 into a plurality of row channels 320 are visibly apparent as gap, or ghost, lines 530 and, because of their contrast with the plurality of parallel conductive lines or features (e.g., conductive lines 510 and 520 of FIG. 6), renders the second conductive 430 more visibly apparent. Taken together, the conventional linear channel breaks 530 render a touch sensor 130 more visibly apparent.

In touch sensor applications, it is desirable to reduce the visibility of the touch sensor 130 and its constituent conductive patterns 420, 430 to an end user. While the individual conductive lines or features (e.g., 510 and 520 of FIG. 5 or 6) are non-transparent, their visibility may be reduced by one or more of their shape, size, composition, stackup, and application of a passivation layer. In certain touch sensor applications, where the individual conductive lines or features are non-transparent and have micrometer-fine line widths, the visibility of the individual conductive lines or features may be reduced such that they are not readily discernible to an end user. However, these measures are not effective for reducing channel break visibility or, by contrast, conductive pattern 420, 430 or touch sensor 130 visibility. The use of conventional linear channel breaks 530 renders the breaks 530 more visibly apparent and by contrast renders the conductive patterns 420, 430 or touch sensor 130 in which they may be disposed more visibly apparent. As such, while the use of conventional linear channel breaks 530 is desirable from an ease of implementation (design-side) standpoint, their use is contrary to the goal of reducing the visibility of the conductive patterns 420, 430 or touch sensor 130 in which they may be disposed.

In one or more embodiments of the present invention, a touch sensor with reduced channel break visibility uses non-linear channel breaks (not shown) to electrically isolate adjacent channels. The design of the non-linear channel breaks prevents the human eye from integrating or otherwise recognizing the pattern of gaps between adjacent channels such that the visibility of the non-linear channel breaks is reduced or eliminated. Advantageously, the reduced or eliminated visibility of the non-linear channel breaks reduces or eliminates the visibility of the conductive patterns or touch sensor in which they may be disposed to the end user.

Figure 8:
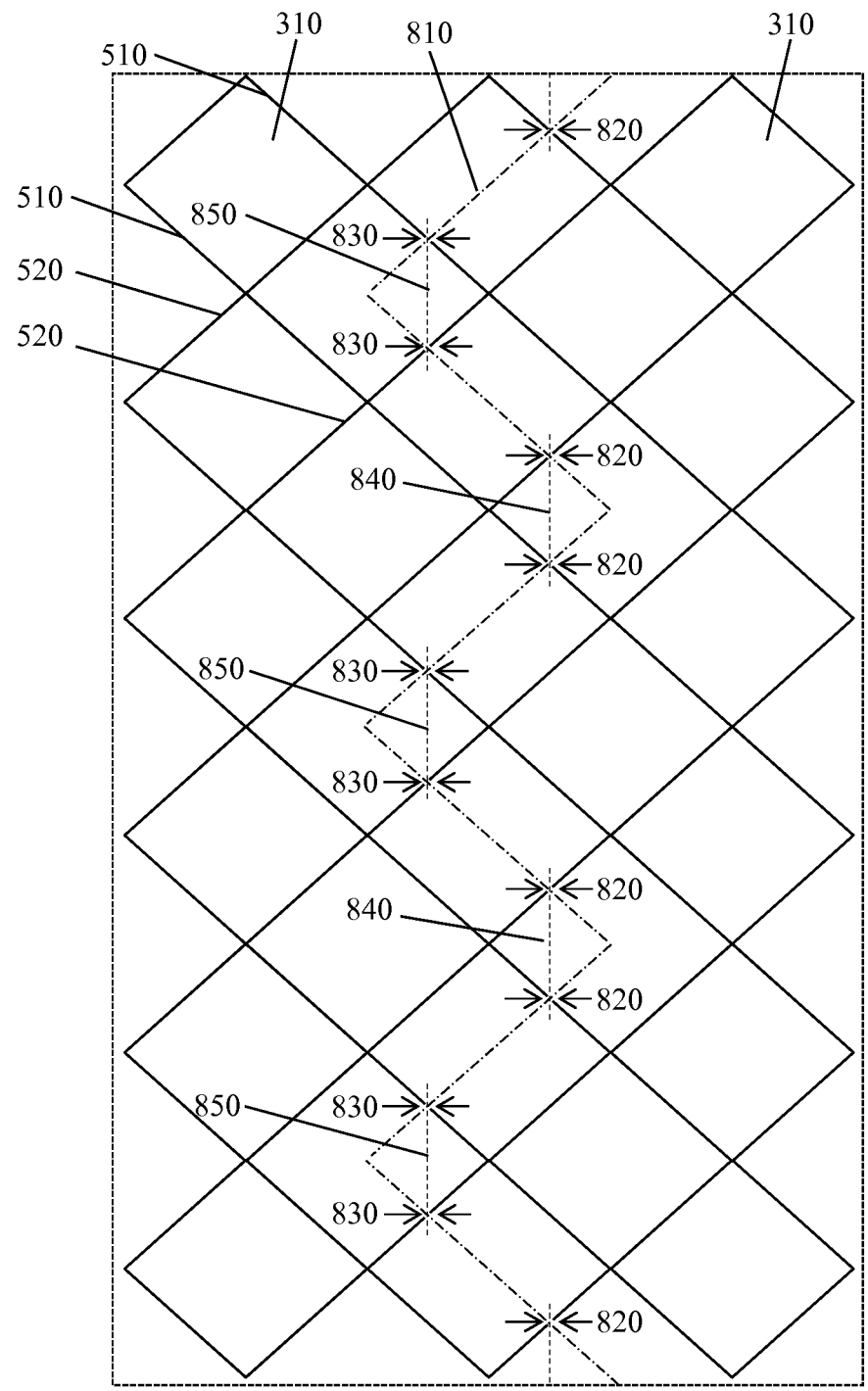
FIG. 8 shows a zoomed in portion of a conductive pattern with a non-linear aligned zig-zag channel break pattern in accordance with one or more embodiments of the present invention.

FIG. 8 shows a zoomed in portion of a conductive pattern (e.g., 420 of FIG. 5) with a non-linear aligned zig-zag channel break 810 pattern in accordance with one or more embodiments of the present invention. While FIG. 8 depicts a zoomed in portion of the conductive pattern, the non-linear aligned zig-zag channel break 810 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear aligned zig-zag channel breaks 810. A non-linear aligned zig-zag channel break 810 may be a virtual zig-zag pattern 810 of gaps 820 and 830 that form a non-conductive gap between adjacent channels 310. In certain embodiments, a non-linear aligned zig-zag channel break 810 pattern is non-linear and includes no more than two consecutive gaps 820 or two consecutive gaps 830 along the virtual zig-zag pattern 810 that are vertically aligned (or horizontally aligned in the case of row channels 320).

A non-linear aligned zig-zag channel break 810 may be characterized by a number of consecutive conductors oriented in the same direction from one of the plurality of parallel conductive lines oriented in the first direction 510 or the plurality of parallel conductive lines oriented in the second direction 520 that the virtual zig-zag pattern 810 traverses (corresponding to one or more gaps 820 or 830) in a given segment before changing direction. In certain embodiments, each segment of a non-linear aligned zig-zag channel break 810 pattern may traverse two consecutive conductors oriented in the same direction, i.e., two consecutive conductors from the plurality of parallel conductive lines oriented in the first direction 510 or two consecutive conductors from the plurality of parallel conductive lines oriented in the second direction 520, before changing direction. In other embodiments, each segment of a non-linear aligned zig-zag channel break 810 pattern may traverse three consecutive conductors oriented in the same direction (not shown), i.e., three consecutive conductors from the plurality of parallel conductive lines oriented in the first direction 510 or three consecutive conductors from the plurality of parallel conductive lines oriented in the second direction 520, before changing direction. In still other embodiments, each segment of a non-linear aligned zig-zag channel break 810 pattern may traverse four consecutive conductors oriented in the same direction (not shown), i.e., four consecutive conductors from the plurality of parallel conductive lines oriented in the first direction 510 or four consecutive conductors from the plurality of parallel conductive lines oriented in the second direction 520, before changing direction. In still other embodiments, each segment of a non-linear aligned zig-zag channel break 810 pattern may traverse more than four consecutive conductors oriented in the same direction (not shown) before changing direction.

One of ordinary skill in the art will recognize that as the number consecutive conductors oriented in the same direction that are traversed in a given segment before changing direction increases, a size of the virtual zig-zag pattern 810 formed increases, which may negatively impact the granularity of the boundary between adjacent channels 310 and the precision of a touch sensor in which it is used. One of ordinary skill in the art will also recognize that so long as the number of consecutive conductors traversed before changing direction is two or more, a non-linear aligned zig-zag channel break 810 includes no more than two consecutive gaps 820 or two consecutive gaps 30 along the break 810 pattern that are vertically aligned. As such, the human eye does not tend to integrate or otherwise recognize the non-linear aligned zig-zag channel break 810 pattern as a ghost line and the non-linear aligned zig-zag channel break 810 pattern is not visibly apparent to an end user. Thus, the reduced channel break visibility reduces the visibility of the conductive patterns and a touch sensor in which they may be disposed.

While FIG. 8 depicts a non-linear aligned zig-zag channel break 810 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

Figure 9:
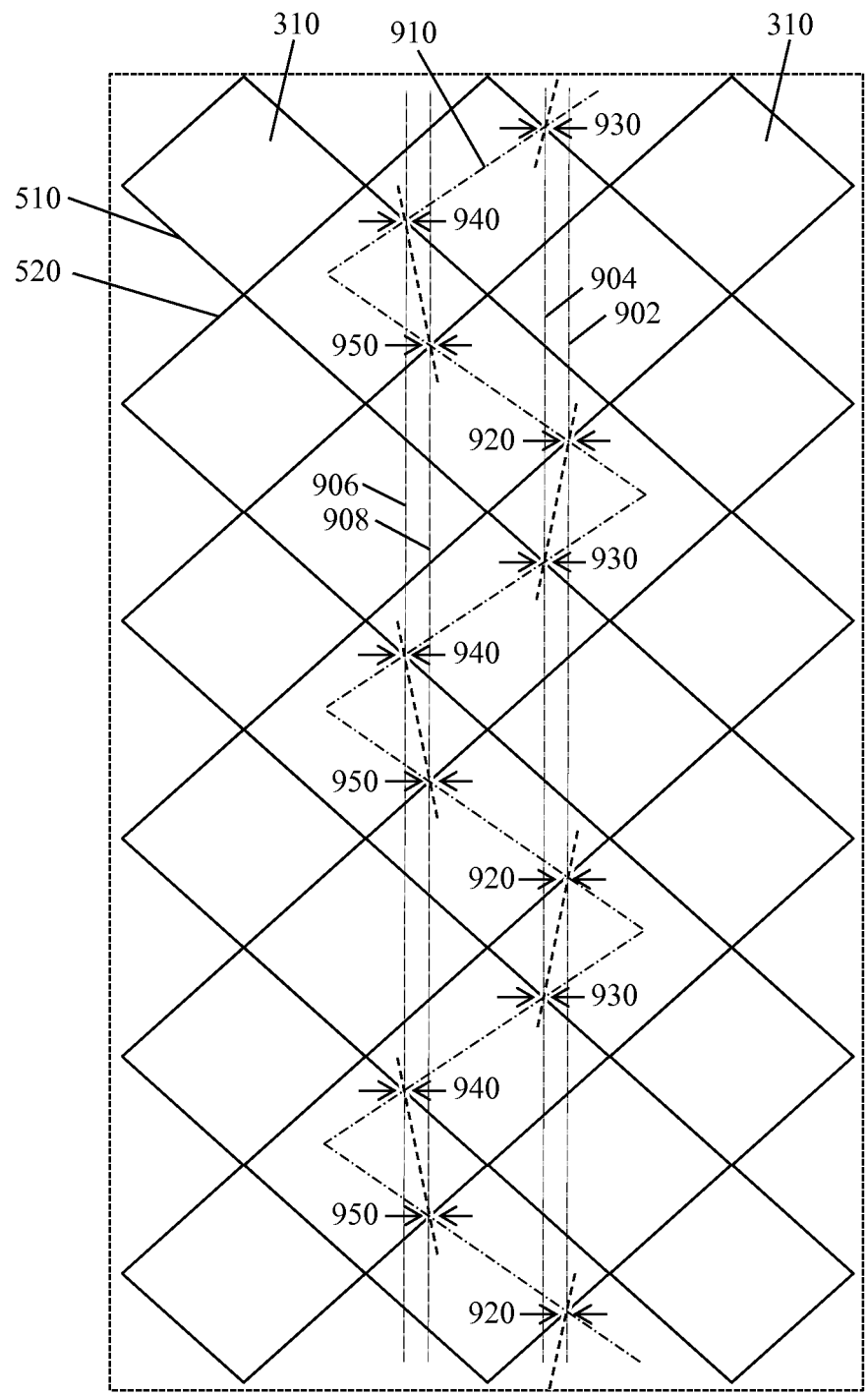
FIG. 9 shows a zoomed in portion of a conductive pattern with a non-linear outward angled zig-zag channel break pattern in accordance with one or more embodiments of the present invention.

FIG. 9 shows a zoomed in portion of a conductive pattern (e.g., 420 of FIG. 5) with a non-linear outward angled zig-zag channel break 910 pattern in accordance with one or more embodiments of the present invention. While FIG. 9 depicts a zoomed in portion of the conductive pattern, the non-linear outward angled zig-zag channel break 910 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear outward angled zig-zag channel breaks 910. A non-linear outward angled zig-zag channel break 910 may be a virtual zig-zag pattern 910 of gaps 920, 930, 940, and 950 that form a non-conductive gap between adjacent channels 310. Gaps 920 are aligned to a first vertical axis 902, gaps 930 are aligned to a second vertical axis 904, gaps 940 are aligned to a third vertical axis 906, and gaps 950 are aligned to a fourth vertical axis 908. A spacing between the axes 902, 904, 906, and 908 may vary based on an application or design. A virtual line segment through each pair of consecutive gaps 920 and 930 along the pattern 910 and a virtual line segment through each pair of consecutive gaps 940 and 950 along the pattern 910 are angled outward with respect to the vertical axis. In certain embodiments, a non-linear outward angled zig-zag channel break 910 pattern is non-linear and there are no consecutive gaps 920, 930, 940, or 950 along the virtual zig-zag pattern 910 that are vertically aligned (or horizontally aligned in the case of row channels 320).

A non-linear outward angled zig-zag channel break 910 may be characterized by a number of consecutive conductors oriented in the same direction from one of the plurality of parallel conductive lines oriented in the first direction 510 or the plurality of parallel conductive lines oriented in the second direction 520, that the virtual zig-zag pattern 910 traverses (corresponding to one or more gaps 920, 930, 940, or 950) in a given segment before changing direction. In certain embodiments, each segment of a non-linear outward angled zig-zag channel break 910 pattern may traverse two consecutive conductors oriented in the same direction, i.e., two consecutive conductors from the plurality of parallel conductive lines oriented in the first direction 510 or two consecutive conductors from the plurality of parallel conductive lines oriented in the second direction 520, before changing direction. In other embodiments, each segment of a non-linear outward angled zig-zag channel break 910 pattern may traverse three consecutive conductors oriented in the same direction (not shown), i.e., three consecutive conductors from the plurality of parallel conductive lines oriented in the first direction 510 or three consecutive conductors from the plurality of parallel conductive lines oriented in the second direction 520, before changing direction. In still other embodiments, each segment of a non-linear outward angled zig-zag channel break 910 pattern may traverse four consecutive conductors oriented in the same direction (not shown), i.e., four consecutive conductors from the plurality of parallel conductive lines oriented in the first direction 510 or four consecutive conductors from the plurality of parallel conductive lines oriented in the second direction 520, before changing direction. In still other embodiments, each segment of a non-linear outward angled zig-zag channel break 910 pattern may traverse more than four consecutive conductors oriented in the same direction (not shown) before changing direction. In still other embodiments, there is no need to angle the zig-zag channel break 910 if the break 910 traverses one or more conductive lines 510 only or traverses one or more conductive lines 520 only. However, if the zig-zag channel break 910 traverses any conductive line 510 and then traverses a conductive line 520, or vice versa, the application of an angle to the gaps may be helpful to reduce visibility.

One of ordinary skill in the art will recognize that as the number consecutive conductors oriented in the same direction that are traversed in a given segment before changing direction increases, a size of the virtual zig-zag pattern 910 formed increases, which may negatively impact the granularity of the boundary between adjacent channels 310 and the precision of a touch sensor in which it is used. One of ordinary skill in the art will also recognize that, independent of size, a non-linear outward angled zig-zag channel break 910 includes no consecutive gaps along the break 910 pattern that are vertically aligned. As such, the human eye does not tend to integrate or otherwise recognize the non-linear outward angled zig-zag channel break 910 pattern as a ghost line and the non-linear outward angled zig-zag channel break 910 pattern is not visibly apparent to an end user. Thus, the reduced channel break visibility reduces the visibility of the conductive pattern and a touch sensor in which it may be disposed.

While FIG. 9 depicts a non-linear outward angled zig-zag channel break 910 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

Figure 10:
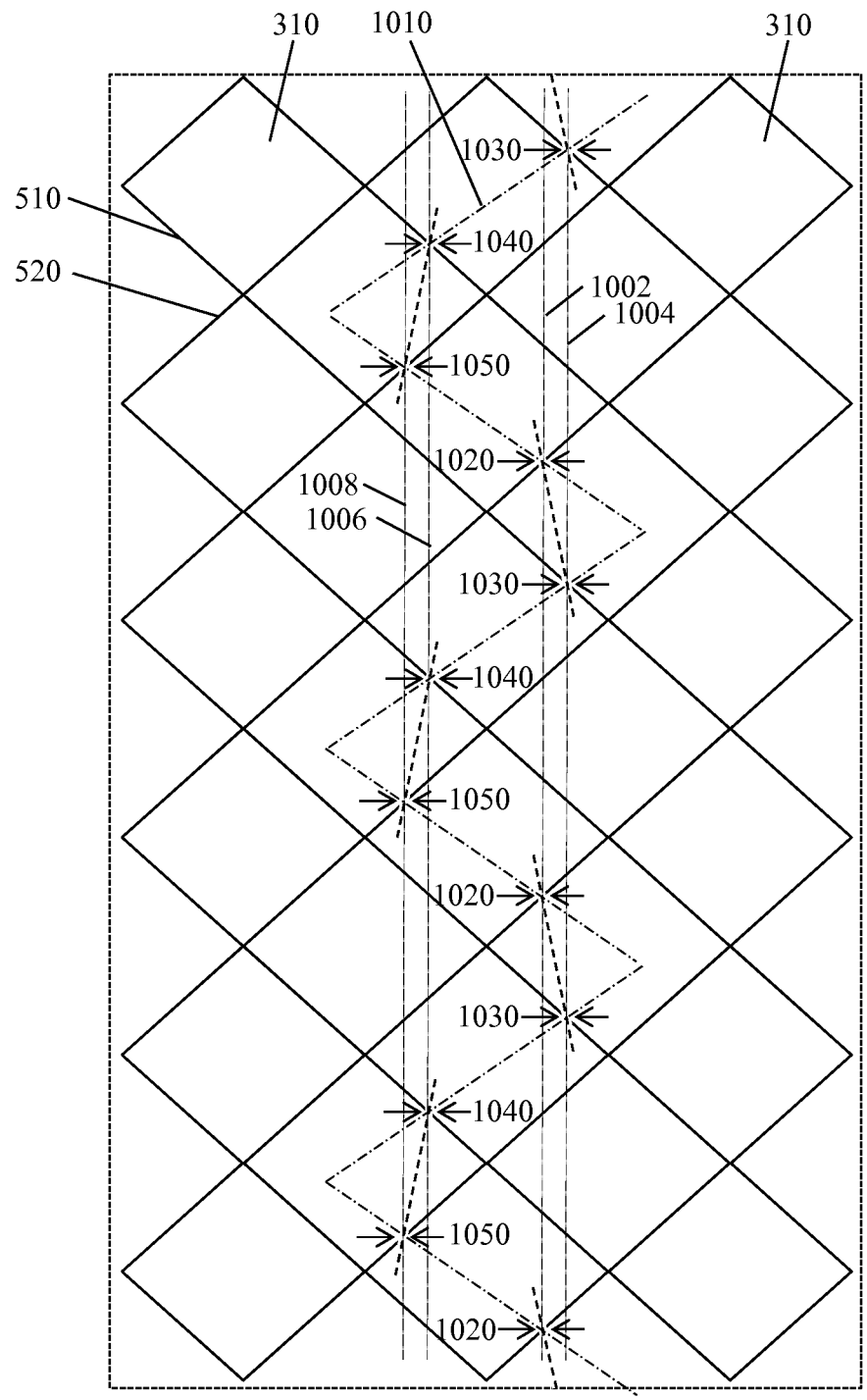
FIG. 10 shows a zoomed in portion of a conductive pattern with a non-linear inward angled zig-zag channel break pattern in accordance with one or more embodiments of the present invention.

FIG. 10 shows a zoomed in portion of a conductive pattern (e.g., 420 of FIG. 5) with a non-linear inward angled zig-zag channel break 1010 pattern in accordance with one or more embodiments of the present invention. While FIG. 10 depicts a zoomed in portion of the conductive pattern, the non-linear inward angled zig-zag channel break 1010 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear inward angled zig-zag channel breaks 1010. A non-linear inward angled zig-zag channel break 1010 may be a virtual zig-zag pattern 1010 of gaps 1020, 1030, 1040, and 1050 that form a non-conductive gap between adjacent channels 310. Gaps 1020 are aligned to a first vertical axis 1002, gaps 1030 are aligned to a second vertical axis 1004, gaps 1040 are aligned to a third vertical axis 1006, and gaps 1050 are aligned to a fourth vertical axis 1008. A spacing between the axes 1002, 1004, 1006, and 1008 may vary based on an application or design. A virtual line segment through each pair of consecutive gaps 1020 and 1030 and a virtual line segment through each pair of consecutive gaps 1040 and 1050 are angled inward with respect to the vertical axis. In certain embodiments, a non-linear inward angled zig-zag channel break 1010 pattern is non-linear and there are no consecutive gaps 1020, 1030, 1040, or 1050 along the virtual zig-zag pattern 1010 that are vertically aligned (or horizontally aligned in the case of row channels 320).

A non-linear inward angled zig-zag channel break 1010 may be characterized by a number of consecutive conductors oriented in the same direction from one of the plurality of parallel conductive lines oriented in the first direction 510 or the plurality of parallel conductive lines oriented in the second direction 520, that the virtual zig-zag pattern 1010 traverses (corresponding to one or more gaps 1020, 1030, 1040, or 1050) in a given segment before changing direction. In certain embodiments, each segment of a non-linear inward angled zig-zag channel break 1010 pattern may traverse two consecutive conductors oriented in the same direction, i.e., two consecutive conductors from the plurality of parallel conductive lines oriented in the first direction 510 or two consecutive conductors from the plurality of parallel conductive lines oriented in the second direction 520, before changing direction. In other embodiments, each segment of a non-linear inward angled zig-zag channel break 1010 pattern may traverse three consecutive conductors oriented in the same direction (not shown), i.e., three consecutive conductors from the plurality of parallel conductive lines oriented in the first direction 510 or three consecutive conductors from the plurality of parallel conductive lines oriented in the second direction 520, before changing direction. In still other embodiments, each segment of a non-linear inward angled zig-zag channel break 1010 pattern may traverse four consecutive conductors oriented in the same direction (not shown), i.e., four consecutive conductors from the plurality of parallel conductive lines oriented in the first direction 510 or four consecutive conductors from the plurality of parallel conductive lines oriented in the second direction 520, before changing direction. In still other embodiments, each segment of a non-linear inward angled zig-zag channel break 1010 pattern may traverse more than four consecutive conductors oriented in the same direction (not shown) before changing direction. In still other embodiments, there is no need to angle the zig-zag channel break 1010 if the break traverses one or more conductive lines 510 only or traverses one or more conductive lines 520 only. However, if the zig-zag channel break 1010 traverses any conductive line 510 and then traverses a conductive line 520, or vice versa, the application of an angle to the gaps may be helpful to reduce visibility.

One of ordinary skill in the art will recognize that as the number consecutive conductors oriented in the same direction that are traversed in a given segment before changing direction increases, a size of the virtual zig-zag pattern 1010 formed increases, which may negatively impact the granularity of the boundary between adjacent channels 310 and the precision of a touch sensor in which it is used. One of ordinary skill in the art will also recognize that, independent of size, a non-linear inward angled zig-zag channel break 1010 includes no consecutive gaps that are vertically aligned. As such, the human eye does not tend to integrate or otherwise recognize the non-linear inward angled zig-zag channel break 1010 pattern as a ghost line and the non-linear inward angled zig-zag channel break 1010 pattern is not visibly apparent to an end user. Thus, the reduced channel break visibility reduces the visibility of the conductive pattern and a touch sensor in which it may be disposed.

One of ordinary skill in the art will recognize that other channel break patterns (not shown), such as, for example, a channel break pattern where groups of two or more consecutive gaps are aligned in a same direction, but are not vertically aligned, may be used in accordance with one or more embodiments of the present invention.

While FIG. 10 depicts a non-linear inward angled zig-zag channel break 1010 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

Figure 11:
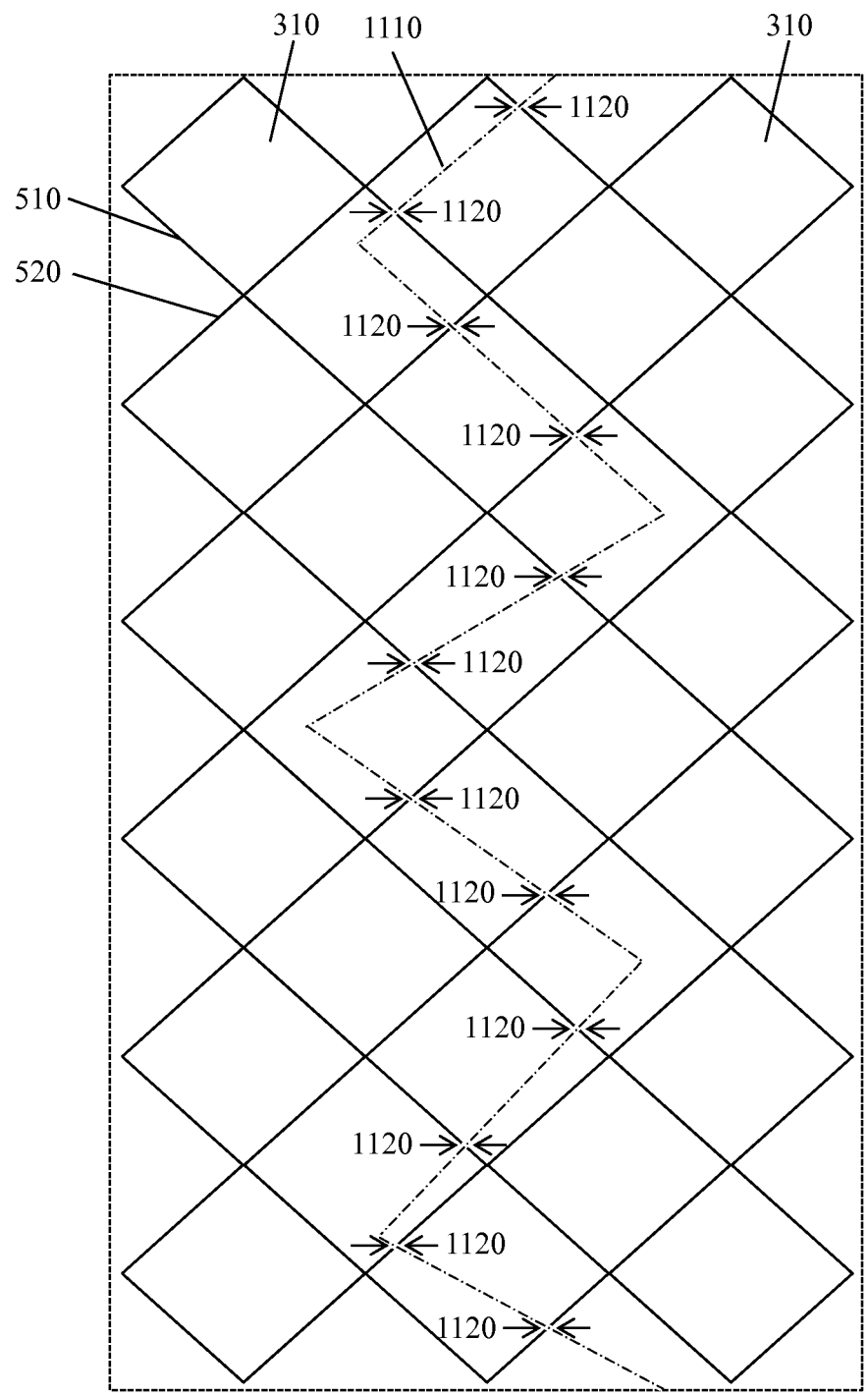
FIG. 11 shows a zoomed in portion of a conductive pattern with a non-linear randomized zig-zag channel break pattern in accordance with one or more embodiments of the present invention.

FIG. 11 shows a zoomed in portion of a conductive pattern (e.g., 420 of FIG. 5) with a non-linear randomized zig-zag channel break 1110 pattern in accordance with one or more embodiments of the present invention. While FIG. 11 depicts a zoomed in portion of the conductive pattern, the non-linear randomized zig-zag channel break 1110 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear randomized zig-zag channel breaks 1110. A non-linear randomized zig-zag channel break 1110 may be a virtual zig-zag pattern 1110 of gaps 1120 that form a non-conductive gap between adjacent channels 310. The segments of the virtual zig-zag pattern 1110 are not necessarily aligned and may be randomly angled, but maintain the general zig-zag shape. As such, the gaps 1120 of a non-linear randomized zig-zag pattern 1110 are typically not aligned and there are typically no consecutive gaps 1120 that are vertically aligned. In certain embodiments, a non-linear randomized zig-zag channel break 1110 pattern is non-linear and there are typically no consecutive gaps 1120 along the virtual zig-zag pattern 1110 that are vertically aligned (or horizontally aligned in the case of row channels 320).

A non-linear randomized zig-zag channel break 1110 may be characterized by a number of consecutive conductors oriented in the same direction from one of the plurality of parallel conductive lines oriented in the first direction 510 or the plurality of parallel conductive lines oriented in the second direction 520, that the virtual zig-zag pattern 1110 traverses (corresponding to one or more gaps 1120) in a given segment before changing direction. In certain embodiments, each segment of a non-linear randomized zig-zag channel break 1110 pattern may traverse two consecutive conductors oriented in the same direction, i.e., two consecutive conductors from the plurality of parallel conductive lines oriented in the first direction 510 or two consecutive conductors from the plurality of parallel conductive lines oriented in the second direction 520, before changing direction. In other embodiments, each segment of a non-linear randomized zig-zag channel break 1110 pattern may traverse three consecutive conductors oriented in the same direction (not shown), i.e., three consecutive conductors from the plurality of parallel conductive lines oriented in the first direction 510 or three consecutive conductors from the plurality of parallel conductive lines oriented in the second direction 520, before changing direction. In still other embodiments, each segment of a non-linear randomized zig-zag channel break 1110 pattern may traverse four consecutive conductors oriented in the same direction (not shown), i.e., four consecutive conductors from the plurality of parallel conductive lines oriented in the first direction 510 or four consecutive conductors from the plurality of parallel conductive lines oriented in the second direction 520, before changing direction. In still other embodiments, each segment of a non-linear randomized zig-zag channel break 1110 pattern may traverse more than four consecutive conductors oriented in the same direction (not shown) before changing direction.

One of ordinary skill in the art will recognize that as the number consecutive conductors oriented in the same direction that are traversed in a given segment before changing direction increases, a size of the virtual zig-zag pattern 1110 formed increases, which may negatively impact the granularity of the boundary between adjacent channels 310 and the precision of a touch sensor in which it is used. One of ordinary skill in the art will also recognize that, independent of size, a non-linear randomized zig-zag channel break 1110 typically includes no consecutive gaps 1120 that are vertically aligned. As such, the human eye does not tend to integrate or otherwise recognize the non-linear includes randomized zig-zag channel break 1110 pattern as a ghost line and the non-linear randomized zig-zag channel break 1110 pattern is not visibly apparent to an end user. Thus, the reduced channel break visibility reduces the visibility of the conductive pattern and a touch sensor in which it may be disposed.

While FIG. 11 depicts a non-linear randomized zig-zag channel break 1010 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

Figure 12:
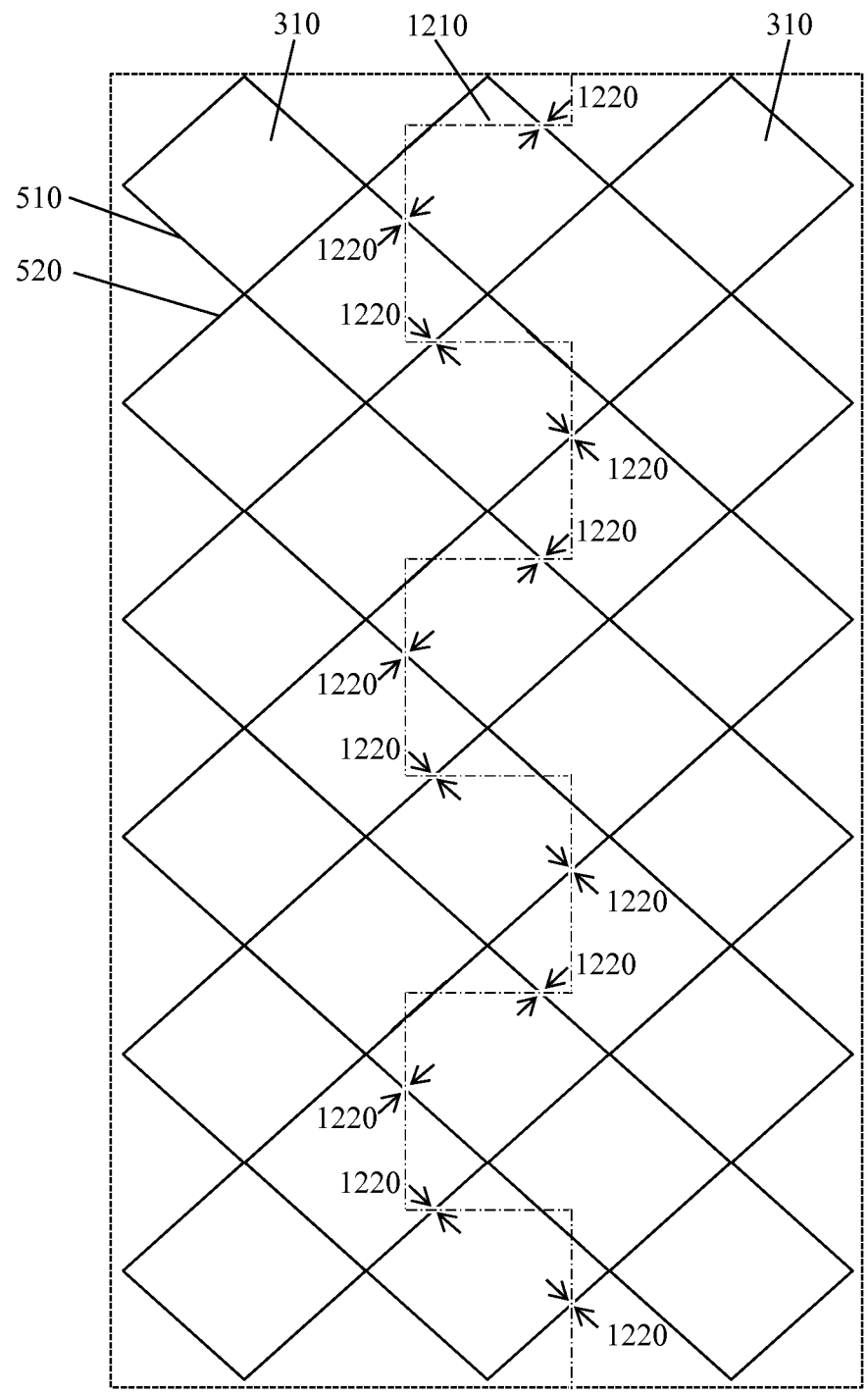
FIG. 12 shows a zoomed in portion of a conductive pattern with a non-linear square-wave channel break pattern in accordance with one or more embodiments of the present invention.

FIG. 12 shows a zoomed in portion of a conductive pattern (e.g., 420 of FIG. 5) with a non-linear square-wave channel break 1210 pattern in accordance with one or more embodiments of the present invention. While FIG. 12 depicts a zoomed in portion of the conductive pattern, the non-linear square-wave channel break 1210 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear square-wave channel breaks 1210. A non-linear square-wave channel break 1210 may be a virtual square-wave pattern 1210 of gaps 1220 that form a non-conductive gap between adjacent channels 310. In certain embodiments, a non-linear square-wave channel break 1210 pattern is non-linear and there are no consecutive gaps 1220 along the virtual square-wave pattern 1210 that are vertically or horizontally aligned.

A non-linear square-wave channel break 1210 may be characterized by a number of conductors that the virtual square-wave pattern 1210 traverses (corresponding to one or more gaps 1220) in a given segment before changing direction. In certain embodiments, each segment of a non-linear square-wave channel break 1210 pattern may traverse two conductors before changing direction. By limiting the number of conductors traversed in any direction along the virtual square-wave pattern 1210 to two, the visibility of a non-linear square-wave channel break 1210 may be reduced as compared to embodiments where more consecutive conductors are traversed. In other embodiments, each segment of a non-linear square-wave channel break 1210 pattern may traverse three conductors (not shown) before changing direction. In still other embodiments, each segment of a non-linear square-wave channel break 1210 pattern may traverse four conductors (not shown) before changing direction. In still other embodiments, each segment of a non-linear square-wave channel break 1210 pattern may traverse more than four conductors (not shown) before changing direction. However, care should be taken to avoid the creation of electrically isolated dummy conductors that are not electrically connected to any column channel 310. For example, in the embodiment depicted in FIG. 12, the corners of square-wave channel break 1210 pattern traverse the same conductive line 510 or 520 more than once and the placement of gaps 1220 at those locations (not shown) would create an electrically isolated dummy conductor (not show) in between the respective gaps. As such, the square-wave channel break 1210 pattern may be created using the same process set forth above, where gaps are placed at each and every crossing of a conductive line 510 or 520 and then removing one or more gaps 1220 that give rise to electrically isolated dummy conductors that are not electrically connected to any column channel 310.

One of ordinary skill in the art will recognize that as the number conductors traversed by a given segment before changing direction increases, a size of the virtual square-wave pattern 1210 formed increases, which may negatively impact the granularity of the boundary between adjacent channels 310 and the precision of a touch sensor in which it is used. One of ordinary skill in the art will also recognize that, in certain embodiments, a non-linear square-wave channel break 1210 includes no more than two consecutive gaps 1220 that are vertically or horizontally aligned. As such, the human eye does not tend to integrate or otherwise recognize the non-linear square-wave channel break 1210 as a ghost line and the non-linear square-wave channel break 1210 is not visibly apparent to an end user. Thus, the reduced channel break visibility reduces the visibility of the conductive pattern and a touch sensor in which it may be disposed.

While FIG. 12 depicts a non-linear square-wave channel break 1210 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

Figure 13:
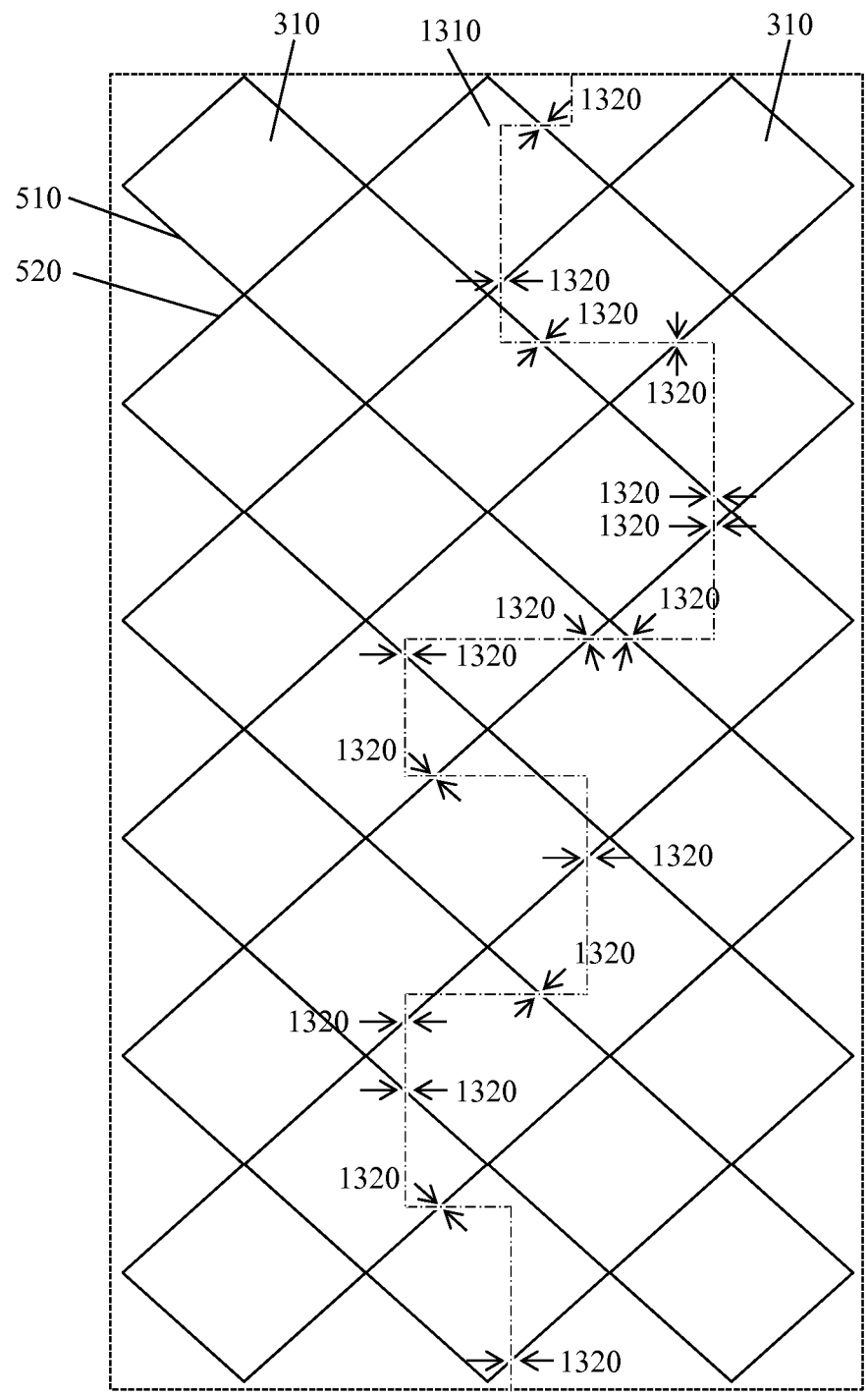
FIG. 13 shows a zoomed in portion of a conductive pattern with a non-linear randomized square-wave channel break pattern in accordance with one or more embodiments of the present invention.

FIG. 13 shows a zoomed in portion of a conductive pattern (e.g., 420 of FIG. 5) with a non-linear randomized square-wave channel break 1310 pattern in accordance with one or more embodiments of the present invention. While FIG. 13 depicts a zoomed in portion of the conductive pattern, the non-linear randomized square-wave channel break 1310 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear randomized square-wave channel breaks 1210. A non-linear randomized square-wave channel break 1310 may be a virtual randomized square-wave pattern 1310 of gaps 1320 that form a non-conductive gap between adjacent channels 310. In certain embodiments, a non-linear randomized square-wave channel break 1310 pattern is non-linear and there are typically no, and at most very few, consecutive gaps 1320 along the virtual randomized square-wave pattern 1310 that are vertically or horizontally aligned.

A non-linear randomized square-wave channel break 1310 may be characterized by a number of segments, each of which traverses (corresponding to one or more gaps 1320) a random number of conductors before changing direction while maintaining a square-wave shape. The random number of conductors that the virtual randomized square-wave pattern 1310 traverses before changing direction may vary from segment to segment and may be constrained by a maximum number. In order to reduce the visibility of a non-linear randomized square-wave channel break 1310, in certain embodiments, the maximum number may be selected such that the number of conductors traversed in a given segment is limited to prevent the human eye from integrating or otherwise recognizing the non-linear randomized square-wave channel break 1310 pattern as a ghost line. In certain embodiments, the maximum number of conductors traversed before changing direction may be limited to no more than two conductors traversed. As such, the human eye does not tend to integrate or otherwise recognize the non-linear randomized square-wave channel break 1310 pattern as a ghost line and the non-linear randomized square-wave channel break 1310 pattern is not visibly apparent to an end user. Thus, the reduced channel break visibility reduces the visibility of the conductive pattern and a touch sensor in which it may be disposed. In other embodiments, the maximum number of conductors traversed before changing direction may be greater than two and may vary based on an application or design (not shown) while still reducing channel break visibility. For example, the number may vary based on a feature size, a pitch, or a density of the constituent conductive lines or features of the conductive pattern. However, care should be taken to avoid the creation of electrically isolated dummy conductors that are not electrically connected to any column channel 310. As such, the randomized square-wave channel break 1310 pattern may be created using the same process set forth above, where gaps are placed at each and every crossing of a conductive line 510 or 520 and then removing one or more gaps 1320 that give rise to electrically isolated dummy conductors that are not electrically connected to any column channel 310.

One of ordinary skill in the art will recognize that as the number conductors traversed by a given segment before changing direction increases, a size of the virtual randomized square-wave pattern 1310 formed increases, which may negatively impact the granularity of the boundary between adjacent channels 310 and the precision of a touch sensor in which it is used. One of ordinary skill in the art will also recognize that, in certain embodiments, a non-linear randomized square-wave channel break 1310 typically includes no, or at most very few, such as, for example, two consecutive gaps 1320 that are vertically or horizontally aligned. As such, the human eye does not tend to integrate or otherwise recognize the non-linear randomized square-wave channel break 1310 pattern as a ghost line and the non-linear randomized square-wave channel break 1310 pattern is not visibly apparent to an end user. Thus, the reduced channel break visibility reduces the visibility of the conductive pattern and a touch sensor in which it may be disposed.

While FIG. 13 depicts a non-linear randomized square-wave channel break 1310 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

Figure 14:
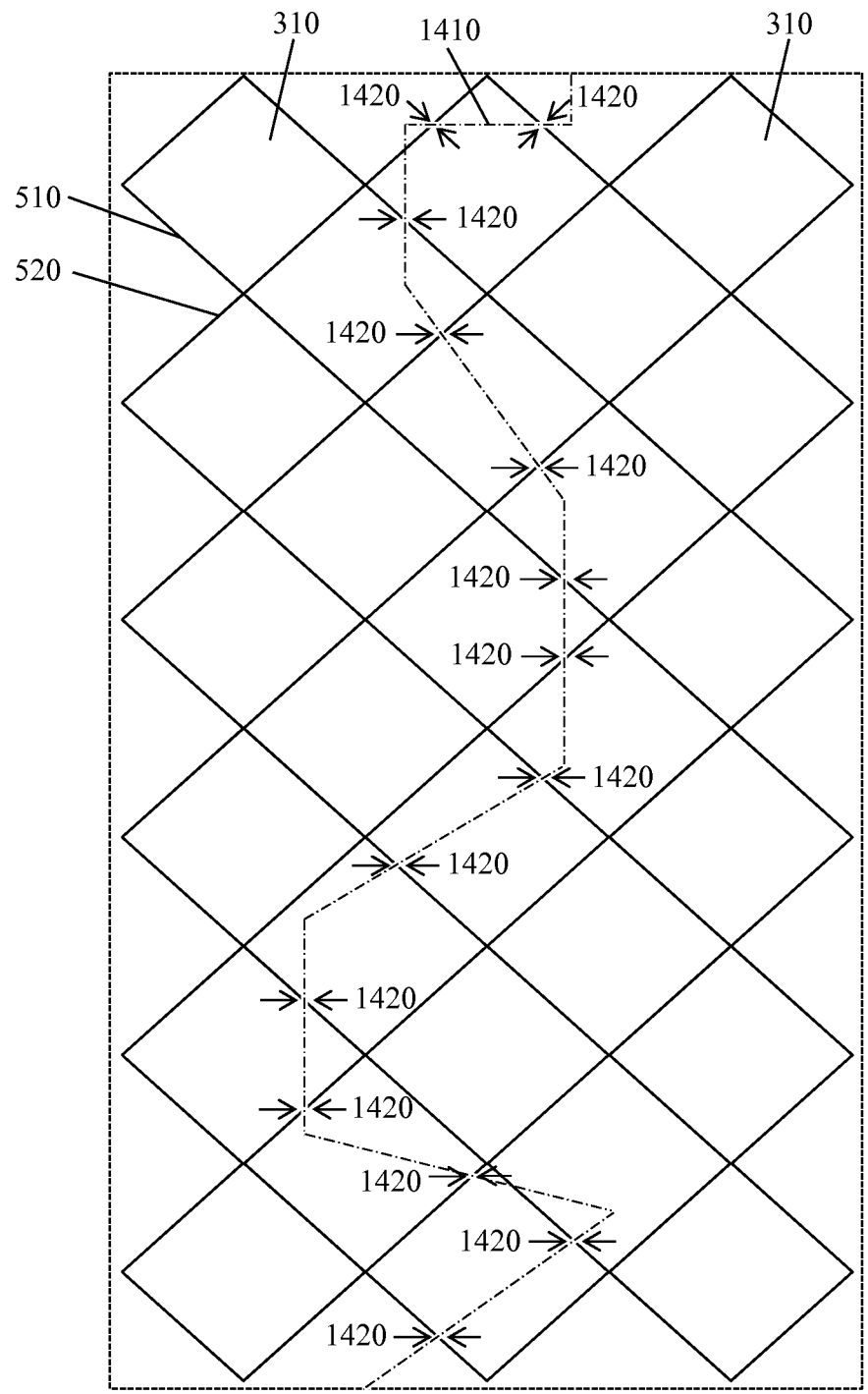
FIG. 14 shows a zoomed in portion of a conductive pattern with a non-linear randomized hybrid channel break pattern in accordance with one or more embodiments of the present invention.

FIG. 14 shows a zoomed in portion of a conductive pattern (e.g., 420 of FIG. 5) with a non-linear randomized hybrid channel break 1410 pattern in accordance with one or more embodiments of the present invention. While FIG. 14 depicts a zoomed in portion of the conductive pattern, the non-linear randomized hybrid channel break 1410 pattern may span a length or a width of the conductive pattern.

A conductive pattern may include a plurality of conductive lines or features arranged in a pattern. In certain embodiments, the conductive pattern may include a plurality of parallel conductive lines oriented in a first direction 510 and a plurality of parallel conductive lines oriented in a second direction 520 arranged in a mesh pattern. The relative angle between the plurality of parallel conductive lines oriented in the first direction 510 and the plurality of parallel conductive lines oriented in the second direction 520 may vary based on an application or design. In one or more embodiments of the present invention, the conductive pattern may be partitioned into a plurality of channels 310, each electrically isolated from one another, by a plurality of non-linear randomized hybrid channel breaks 1410. A non-linear randomized hybrid channel break 1410 may be a virtual randomized hybrid pattern 1410 of gaps 1420 that form a non-conductive gap between adjacent channels 310. In certain embodiments, a non-linear randomized hybrid channel break 1410 pattern is non-linear and there are typically no, or at most very few, consecutive gaps 1420 along the virtual randomized hybrid pattern 1410 that are vertically or horizontally aligned.

A non-linear randomized hybrid channel break 1410 may be characterized by a number of segments oriented in random directions, each of which traverses (corresponding to one or more gaps 1320) a random number of conductors before changing direction. The random number of conductors that the virtual randomized hybrid pattern 1410 traverses before changing direction may vary from segment to segment and may be constrained by a maximum number. In order to reduce the visibility of a non-linear randomized hybrid channel break 1410, in certain embodiments, the maximum number may be selected such that the number of conductors traversed is limited to prevent the human eye from integrating or otherwise recognizing the non-linear randomized hybrid channel break 1410 pattern as a ghost line. In certain embodiments, the maximum number of conductors traversed before changing direction may be limited to no more than two conductors traversed. As such, the human eye does not tend to integrate or otherwise recognize the non-linear randomized hybrid channel break 1410 pattern as a ghost line and the non-linear randomized hybrid channel break 1410 pattern is not visibly apparent to an end user. Thus, the reduced channel break visibility reduces the visibility of the conductive pattern and a touch sensor in which it may be disposed. In other embodiments, the maximum number of conductors traversed before changing direction may be greater than two and may vary based on an application or design (not shown) while still reducing channel break visibility. For example, the number may vary based on a feature size, a pitch, or a density of the constituent conductive lines or features of the conductive pattern. One of ordinary skill in the art will recognize that as the number of conductors traversed before changing direction increases, the granularity of the boundary between adjacent channels 310 and the precision of a touch sensor in which it is used. However, care should be taken to avoid the creation of electrically isolated dummy conductors that are not electrically connected to any column channel 310. As such, the randomized hybrid channel break 1410 pattern may be created using the same process set forth above, where gaps are placed at each and every crossing of a conductive line 510 or 520 and then removing one or more gaps 1420 that give rise to electrically isolated dummy conductors that are not electrically connected to any column channel 310.

One of ordinary skill in the art will recognize that as the number conductors traversed by a given segment before changing direction increases, a size of the virtual randomized hybrid pattern 1410 formed increases, which may negatively impact the granularity of the boundary between adjacent channels 310 and the precision of a touch sensor in which it is used. One of ordinary skill in the art will also recognize that, in certain embodiments, a non-linear randomized hybrid channel break 1410 typically includes no, or at most very few, such as, for example, two consecutive gaps 1420 that are vertically or horizontally aligned. As such, the human eye does not tend to integrate or otherwise recognize the non-linear randomized hybrid channel break 1410 pattern as a ghost line and the non-linear randomized hybrid channel break 1410 pattern is not visibly apparent to an end user. Thus, the reduced channel break visibility reduces the visibility of the conductive pattern and a touch sensor in which it may be disposed.

While FIG. 14 depicts a non-linear randomized hybrid channel break 1410 pattern that partitions a conductive pattern into a plurality of column channels 310, one of ordinary skill in the art will recognize that the same pattern may be used in a similar manner to partition a conductive pattern into a plurality of row channels (e.g., 320 of FIG. 6) in a similar manner in accordance with one or more embodiments of the present invention.

One of ordinary skill in the art will recognize that other non-linear channel break patterns (not shown) may be used in accordance with one or more embodiments of the present invention. Any pattern formed by line segments, sinusoids, or any other shape may be used so long as the number of consecutive gaps aligned along a vertical or horizontal axis are limited to at most a few consecutive gaps, the acceptable number of which may vary based on an application or design, and care is taken not to form electrically isolated dummy conductors.

In one or more embodiments of the present invention, a method of designing a conductive pattern with reduced channel break visibility may be performed using existing software tools used to design a representation of a conductive pattern. For example, a representation of a conductive pattern may be generated in a software application, such as, for example, a CAD software application prior to fabrication of the conductive pattern. In certain embodiments, the representation of the conductive pattern may include a mesh formed by a plurality of representations of parallel conductive lines oriented in a first direction and a plurality of representations of parallel conductive lines oriented in a second direction. The relative angle between the plurality of representations of parallel conductive lines oriented in the first direction and the plurality of representations of parallel conductive lines oriented in the second direction may vary based on an application or design. One of ordinary skill in the art will recognize that the number of representations of parallel conductive lines oriented in the first direction and/or the number of representations of parallel conductive lines oriented in the second direction may vary based on an application or design. One of ordinary skill in the art will also recognize that a size of the representation of the conductive pattern may vary based on an application or a design. In other embodiments, the representation of the conductive pattern may include any other shape or pattern formed by one or more representations of conductive lines or features. One of ordinary skill in the art will recognize that a representation of a conductive pattern is not limited to representations of parallel conductive lines and may comprise any one or more of a representation of a predetermined orientation of line segments, a random orientation of line segments, curved line segments, conductive particles, polygons, or any other shape(s) or pattern(s) in accordance with one or more embodiments of the present invention.

A plurality of non-linear channel break voids may be placed that partition the representation of the conductive pattern into a plurality of channels, wherein each non-linear channel break isolates adjacent channels. Each non-linear channel break void is non-linear and corresponds to a representation of non-conductive gaps between adjacent channels. Each non-linear channel break void may correspond to a pattern of a plurality of gaps that void, or break connectivity, of representations of conductors. In certain embodiments, a gap of the non-linear channel break void may have a line width of less than 5 micrometers. In other embodiments, a gap of the non-linear channel break void may have a line width in a range between approximately 5 micrometers and approximately 10 micrometers. In still other embodiments, a gap of the non-linear channel break void may have a line width in a range between approximately 10 micrometers and approximately 50 micrometers. In certain embodiments, one or more non-linear channel break voids may comprise a non-linear aligned zig-zag channel break pattern. In other embodiments, one or more non-linear channel break voids may comprise a non-linear angled zig-zag channel break pattern. In still other embodiments, one or more non-linear channel break voids may comprise a non-linear randomized zig-zag channel break pattern. In still other embodiments, one or more non-linear channel break voids may comprise a non-linear square-wave channel break pattern. In still other embodiments, one or more non-linear channel break voids may comprise a non-linear randomized square-wave channel break pattern. In still other embodiments, one or more non-linear channel break voids may comprise a non-linear randomized hybrid channel break pattern. One of ordinary skill in the art will recognize that other non-linear channel break patterns may be used in accordance with one or more embodiments of the present invention.

Advantages of one or more embodiments of the present invention may include one or more of the following:

In one or more embodiments of the present invention, a touch sensor with reduced channel break visibility reduces or eliminates the visibility of the non-linear channel breaks to an end user. The human eye tends to integrate or otherwise recognize the pattern of conventional linear channel breaks in a manner that renders conventional linear channel breaks visible as one or more gap, or ghost, lines to an end user. Because of the contrast between the channels and the conventional linear channel breaks, the touch sensor itself is rendered more visible to the end user. The design of the non-linear channel breaks prevents the human eye from integrating or otherwise recognizing the pattern of gaps between adjacent channels such that the visibility of the non-linear channel breaks is reduced or eliminated. Advantageously, the reduced or eliminated visibility of the non-linear channel breaks reduces or eliminates the visibility of the touch sensor to the end user.

In one or more embodiments of the present invention, a touch sensor with reduced channel break visibility may provide more channels than a touch sensor with conventional linear channel breaks. Because the non-linear channel breaks are not integrated or otherwise recognized as a pattern by the human eye, more non-linear channel breaks may be used, creating more channels, without increasing the visibility of the touch sensor.

In one or more embodiments of the present invention, a touch sensor with reduced channel break visibility may use a plurality of non-linear channel breaks where each non-linear channel break electrically isolates adjacent channels.

In one or more embodiments of the present invention, a touch sensor with reduced channel break visibility may use a plurality of non-linear channel breaks where each non-linear channel break may be a non-linear and a non-conductive gap between adjacent channels.

In one or more embodiments of the present invention, a touch sensor with reduced channel break visibility may use one or more non-linear channel breaks where a non-linear channel break may be a zig-zag pattern, an angled zig-zag pattern, a randomized zig-zag pattern, a line pattern, a randomized line pattern, or any other non-linear pattern that the human eye does not integrate or otherwise recognize as a pattern when viewing the touch sensor.

In one or more embodiments of the present invention, a touch sensor with reduced channel break visibility may be compatible with any process suitable for designing or fabricating non-transparent conductive patterns on a substrate.

In one or more embodiments of the present invention, a touch sensor with reduced channel break visibility may be designed using the same tools used to design a touch sensor with conventional linear channel breaks. For example, one or more of the conductive patterns of the touch sensor with reduced channel break visibility may be designed in the same CAD software application used to design a touch sensor with conventional linear channel breaks.

In one or more embodiments of the present invention, a touch sensor with reduced channel break visibility does not increase the cost of design of the touch sensor as compared to a touch sensor with conventional linear channel breaks.

In one or more embodiments of the present invention, a touch sensor with reduced channel break visibility may be fabricated using any process used to fabricate non-transparent conductive patterns on substrate.

In one or more embodiments of the present invention, a touch sensor with reduced channel break visibility does not increase the cost of fabrication of the touch sensor as compared to a touch sensor with conventional linear channel breaks.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. A touch sensor with reduced channel break visibility comprising:

a first conductive pattern including a plurality of parallel conductive lines oriented in a first direction and a plurality of parallel conductive lines oriented in a second direction different from the first direction, wherein at least a portion of the plurality of parallel conductive lines oriented in the first direction and a portion of the plurality of parallel conductive lines oriented in the second direction intersect, and wherein the first conductive pattern is divided into a first plurality of channels, adjacent channels being electrically isolated from each other by non-conductive, non-linear channel break patterns; and a second conductive pattern including a plurality of parallel conductive lines oriented in a third direction and a plurality of parallel conductive lines oriented in a fourth direction different from the third direction, wherein at least a portion of the plurality of parallel conductive lines oriented in the third direction and a portion of the plurality of parallel conductive lines oriented in the fourth direction intersect, and wherein the second conductive pattern is divided into a second plurality of channels, adjacent channels being electrically isolated from each other by non-conductive, non-linear channel break patterns;

wherein the non-linear channel break patterns are zig-zag channel break patterns including a plurality of zig-zag segments, each zig-zag segment crossing two or more consecutive parallel conductive lines, all of the crossed conductive lines being oriented in a same direction.

2. The touch sensor of claim 1, further including:
a transparent substrate;
wherein the first conductive pattern is disposed on a first side of the transparent substrate and the second conductive pattern is disposed on a second side of the transparent substrate.

3. The touch sensor of claim 1, further including:
a first transparent substrate; and
a second transparent substrate bonded to the first transparent substrate;
wherein the first conductive pattern is disposed on a side of the first transparent substrate and the second conductive pattern is disposed on a side of the second transparent substrate.

4. The touch sensor of claim 1, wherein each non-linear channel break pattern includes no more than two consecutive non-conductive gaps along a particular non-linear channel break pattern that are vertically aligned.

5. The touch sensor of claim 1, wherein each non-linear channel break pattern includes no more than two consecutive non-conductive gaps along a particular non-linear channel break pattern that are horizontally aligned.

6. The touch sensor of claim 1, wherein at least some of the non-conductive gaps of the non-linear channel break patterns have widths of 5 micrometers or less.

7. The touch sensor of claim 1, wherein at least some of the non-conductive gaps of the non-linear channel break patterns have widths in a range between 5 micrometers and 10 micrometers.

8. The touch sensor of claim 1, wherein at least some of the non-conductive gaps of the non-linear channel break patterns have widths in a range between 10 micrometers and 50 micrometers.

* * * * *